(12) United States Patent
Rosa-Molinar

(10) Patent No.: US 12,211,664 B2
(45) Date of Patent: Jan. 28, 2025

(54) ELECTRON MICROSCOPE IMAGING ADAPTOR

(71) Applicant: The University of Kansas, Lawrence, KS (US)

(72) Inventor: Eduardo Rosa-Molinar, Lawrence, KS (US)

(73) Assignee: University of Kansas, Lawrence, KS (US)

( * ) Notice: Subject to any disclaimer, the term of this patent is extended or adjusted under 35 U.S.C. 154(b) by 345 days.

(21) Appl. No.: 17/633,392

(22) PCT Filed: Aug. 6, 2020

(86) PCT No.: PCT/US2020/045239
§ 371 (c)(1),
(2) Date: Feb. 7, 2022

(87) PCT Pub. No.: WO2021/026371
PCT Pub. Date: Feb. 11, 2021

(65) Prior Publication Data
US 2022/0344123 A1    Oct. 27, 2022

Related U.S. Application Data

(60) Provisional application No. 62/883,496, filed on Aug. 6, 2019, provisional application No. 62/883,918, filed
(Continued)

(51) Int. Cl.
*H01J 37/20* (2006.01)
*G01N 1/06* (2006.01)
(Continued)

(52) U.S. Cl.
CPC .............. *G01N 1/06* (2013.01); *G01N 1/2806* (2013.01); *H01J 37/20* (2013.01);
(Continued)

(58) Field of Classification Search
CPC ...... H01J 37/20; H01J 2237/201; G01N 1/06; G01N 1/2806; G01N 2001/066; G01N 2001/364; G01N 35/00009
(Continued)

(56) References Cited

U.S. PATENT DOCUMENTS 9,304,067 B2    4/2016   Hayworth et al.
9,905,394 B1    2/2018   Bhattiprolu et al.
(Continued)

FOREIGN PATENT DOCUMENTS

CN    104 615 072 A    5/2015
JP    H07 97069 B2    10/1995
(Continued)

OTHER PUBLICATIONS

International Search Report and Written Opinion mailed Oct. 26, 2020 in PCT/US2020/045239 (15 pages).
(Continued)

*Primary Examiner* — Kiet T Nguyen
(74) *Attorney, Agent, or Firm* — Meunier Carlin & Curfman LLC

(57) ABSTRACT

The disclosure describes assemblies and systems for use in reel-to-reel imaging of ultrathin samples. The assemblies and the systems disclosed herein are adapted for use with a plurality of detectors and are configured for use in a variety of electron microscopes. Also, methods of using such assemblies and systems are disclosed.

22 Claims, 15 Drawing Sheets

Related U.S. Application Data on Aug. 7, 2019, provisional application No. 62/891,067, filed on Aug. 23, 2019, provisional application No. 62/893,534, filed on Aug. 29, 2019.

(51) Int. Cl.
  *G01N 1/28* (2006.01)
  *G01N 1/00* (2006.01)
  *G01N 1/36* (2006.01)

(52) U.S. Cl.
  CPC . *G01N 2001/002* (2013.01); *G01N 2001/066* (2013.01); *G01N 2001/364* (2013.01); *H01J 2237/201* (2013.01)

(58) Field of Classification Search
  USPC .................................................. 250/442.11
  See application file for complete search history.

(56) References Cited

U.S. PATENT DOCUMENTS

| | | |
|---|---|---|
| 2012/0001069 A1 | 1/2012 | Kashihara |
| 2014/0158883 A1 | 6/2014 | Zewail |
| 2015/0348746 A1 | 12/2015 | Yue et al. |
| 2016/0343538 A1 | 11/2016 | Kawanishi et al. |
| 2017/0003309 A1 | 1/2017 | Mitra et al. |
| 2017/0205317 A1 | 7/2017 | Zhang et al. |
| 2017/0220775 A1 | 8/2017 | De La Torre-Bueno |
| 2018/0080856 A1 | 3/2018 | Hayworth et al. |
| 2019/0287759 A1* | 9/2019 | Own ...................... H01J 37/147 |

FOREIGN PATENT DOCUMENTS

| | | |
|---|---|---|
| JP | 3859508 B2 | 12/2006 |
| WO | 2018/073443 A1 | 4/2018 |

OTHER PUBLICATIONS

International Search Report and Written Opinion mailed Jan. 7, 2021 in PCT/US2020/045233 (21 pages).

Rice, E., "Benefits of Using Encoders to Improve Step Motor System Performance," Publication, Jun. 1, 2018, <URL: https://www.techbriefs.com/component/content/article/tb/supplements/md/features/articles/28998>.

Own, Christopher S., et al., Reel-to-Reel Electron Microscopy: Latency-Free Continuous Imaging of Large Volume Samples, Microscopy MicroAnalysis 21 (Suppl. 3), doi:10.1017/S1431927615001580, pp. 157-158, Aug. 2, 2015.

Mikula, Shawn, In-Chamber Reel-to-Reel System for Random-Access Volume Electron Microscopy, Microscopy MicroAnalysis 23 (Suppl. 1), doi:10.1017/S1431927617001453, pp. 154-155, Aug. 6, 2017.

Extended European Search Report issued in European Application No. 20849512.7 on Jan. 2, 2024. 19 pages.

\* cited by examiner

ELECTRON MICROSCOPE IMAGING ADAPTOR

CROSS-REFERENCE TO RELATED APPLICATIONS

This is a United States National Phase Patent Application of International Patent Application Number PCT/US2020/045239, filed on Aug. 6, 2020, which claims benefit of U.S. Application Ser. No. 62/883,496, filed on Aug. 6, 2019, U.S. Application Ser. No. 62/883,918, filed on Aug. 7, 2019, U.S. Application Ser. No. 62/891,067, filed on Aug. 23, 2019, and U.S. Provisional Patent Application Ser. No. 62/893,534, filed on Aug. 29, 2019, the contents of which are incorporated herein in their whole entirety.

BACKGROUND

Electron microscopy can be advantageously used to investigate the ultrastructure of biological samples such as cells and tissue, polymer resin samples, and crystalline samples such as inorganic substances. Two types of electron microscopes are known: scanning electron microscopes (SEMs) and transmission electron microscopes (TEMs).

In an electron microscope column, incident electrons are accelerated into, for example, epoxy resin-embedded samples (FIG. 1). A number of interactions between the accelerated electrons and atoms contained within the resin-embedded sample result in elastic and inelastic scattering of electrons (known as the electron interaction volume; FIG. 1). A number of signals generated (i.e., secondary electrons, backscattered electrons, cathodoluminescence, Auger electrons, characteristic X-rays, and Bremsstrahlung X-rays) can be used for high-resolution electron microscopic imaging of ultrastructural features of cell and tissue organelles.

Recently, volume electron microscopy (VEM) gained a lot of interest as it allows analyzing large volumes. Initial procedures for VEM were developed to study the structure of the neural networks in a brain. Modern neuroscience models are often relying on data obtained from serial sectioning brain tissue and subsequent reconstruction. Realistic and meaningful analysis requires morphometric analysis at the ultrastructural level over large sample volumes. Large volumes are required to be statistically relevant and usable for model building.

However, there are still a lot of challenges associated with electron microscopy. Some of the challenges relate to artifacts produced during the imaging process when the samples are not adequately conductive. These challenges were overcome by researchers associated with this disclosure have developed a mechanically flexible and bendable conductive tape that holds tissue, permits nanoscale cellular imaging, and eliminates charging artifacts resulting from the electron beam in scanning electron microscopes, transmission electron microscopes, etc. The conductive tape can also be used for optical light microscopes to transmit light through the substrate for bright-field and fluorescence imaging.

An additional challenge of the volume tissue imaging relates to a lack of automated systems for tape-collecting ultramicrotomy that can be directly transferred into an electron microscope chamber and be imaged without any additional manipulations of the samples.

To take advantage of high-resolution microscopies, the life sciences need better sample preparation workflows, reagents that will overcome charging and sample damage caused by electron beam-sample interactions in the electron microscope, and tools for accurate microscopic imaging in both two dimensional and three-dimensional views. These needs and other needs at least partially satisfied by the present disclosure.

SUMMARY OF THE DISCLOSURE

The present disclosure is directed to a modular reel-to-reel assembly for an electron microscope imaging comprising: a reel-to-reel frame comprising: a) a strut having a first surface and an opposite second surface, a first end and a second end, wherein the strut detachably holds: i) a mounting bracket having a top surface and a bottom surface and extending from the first surface of the strut and is positioned perpendicularly to the first surface of the strut, wherein the mounting bracket comprises a first aperture extending from the top surface to the bottom surface; ii) a feeder motor and a take-up motor coupled to the second surface of the strut such that the feeder motor is spaced from the take-up motor by a predetermined distance; iii) a first rod detachably coupled with the feeder motor through the strut, such that the first rod extends from the first surface of the strut in parallel to the mounting bracket, wherein the feeder motor is configured to spin the first rod at a predetermined speed, and iv) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod; and b) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed; and wherein the reel-to-reel assembly is adapted for use in an electron microscope chamber.

Also in certain aspects, disclosed herein is a modular a modular reel-to-reel assembly for an electron microscope imaging comprising: a reel-to-reel frame comprising: a) a strut having a first surface and an opposite second surface, a first end and a second end, wherein the strut detachably holds: i) a mounting bracket having a top surface and a bottom surface and extending from the first surface of the strut and is positioned perpendicularly to the first surface of the strut, wherein the mounting bracket comprises a first aperture extending from the top surface to the bottom surface; ii) a feeder motor and a take-up motor coupled to the second surface of the strut such that the feeder motor is spaced from the take-up motor by a predetermined distance; iii) a first rod detachably coupled with the feeder motor through the strut, such that the first rod extends from the first surface of the strut in parallel to the mounting bracket, wherein the feeder motor is configured to spin the first rod at a predetermined speed, and iv) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod; b) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed; c) a sampling platform comprising a top surface and a bottom surface, wherein the bottom surface of the sampling platform is configured to be detachably attached to the top surface of the mounting bracket, wherein the top surface of the sampling platform is configured to receive the sample-containing tape as it is relayed from the feeder reel to the take-up reel or from the take-up reel to the feeder reel; and d) an electron-microscope-stage-engaging platform detachably connected to the bottom surface of the mounting bracket; and wherein the reel-to-reel assembly is adapted for use in an electron microscope chamber.

In yet further aspects, disclosed herein is a system for electron microscopy imaging comprising: a) a modular reel-to-reel assembly comprising a reel-to-reel frame comprising: i) a strut having a first surface and an opposite second surface, a first end and a second end, wherein the strut detachably holds: 1) a mounting bracket having a top surface and a bottom surface and extending from the first surface of the strut and is positioned perpendicularly to the first surface of the strut, wherein the mounting bracket comprises a first aperture extending from the top surface to the bottom surface; 2) a feeder motor and a take-up motor coupled to the second surface of the strut such that the feeder motor is spaced from the take-up motor by a predetermined distance; 3) a first rod detachably coupled with the feeder motor through the strut, such that the first rod extends from the first surface of the strut in parallel to the mounting bracket, wherein the feeder motor is configured to spin the first rod at a predetermined speed; and 4) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod; ii) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed; and wherein the reel-to-reel assembly is adapted for use in an electron microscope chamber; and b) a control unit, wherein the control unit is controlling the predetermined speed of the feeder motor and the predetermined speed of the take-up motor.

In still further aspects also disclosed systems for electron microscopy imaging comprising: i) a strut having a first surface and an opposite second surface, a first end and a second end, wherein the strut detachably holds: 1) a mounting bracket having a top surface and a bottom surface and extending from the first surface of the strut and is positioned perpendicularly to the first surface of the strut, wherein the mounting bracket comprises a first aperture extending from the top surface to the bottom surface; 2) a feeder motor and a take-up motor coupled to the second surface of the strut such that the feeder motor is spaced from the take-up motor by a predetermined distance; 3) a first rod detachably coupled with the feeder motor through the strut, such that the first rod extends from the first surface of the strut in parallel to the mounting bracket, wherein the feeder motor is configured to spin the first rod at a predetermined speed; and 4) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod; ii) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed; iii) a sampling platform comprising a top surface and a bottom surface, wherein the bottom surface of the sampling platform is configured to be detachably attached to the top surface of the mounting bracket, wherein the top surface of the sampling platform is configured to receive the sample-containing tape as it is relayed from the feeder reel to the take-up reel or from the take-up reel to the feeder reel; iv) an electron-microscope-stage-engaging platform detachably connected to the bottom surface of the mounting bracket; and b) a control unit, wherein the control unit is controlling the predetermined speed of the feeder motor and the predetermined speed of the take-up motor.

Also disclosed herein is an electron microscope comprising a chamber comprising a stage detachably connected with the modular assembly, as described in previous aspects or aspects described below.

In still further aspects, disclosed herein are methods of sample imaging comprising providing the modular assembly as described in previous aspects or aspects described below; inserting the modular reel-to-reel assembly into an electron microscope chamber, and imaging a sample-containing tape. Also disclosed herein are methods comprising providing the system as described in previous aspects or in aspects described below and imaging a sample-containing tape to create a 3D imaging of the specimen.

Additional aspects of the disclosure will be set forth, in part, in the detailed description, figures, and claims which follow, and in part will be derived from the detailed description or can be learned by practice of the invention. It is to be understood that both the foregoing general description and the following detailed description are exemplary and explanatory only and are not restrictive of the invention as disclosed.

BRIEF DESCRIPTION OF THE DRAWINGS

These and other features, aspects, and advantages of the present invention will become apparent from the following description and the accompanying exemplary implementations shown in the drawings, which are briefly described below.

DETAILED DESCRIPTION

Figure 1:
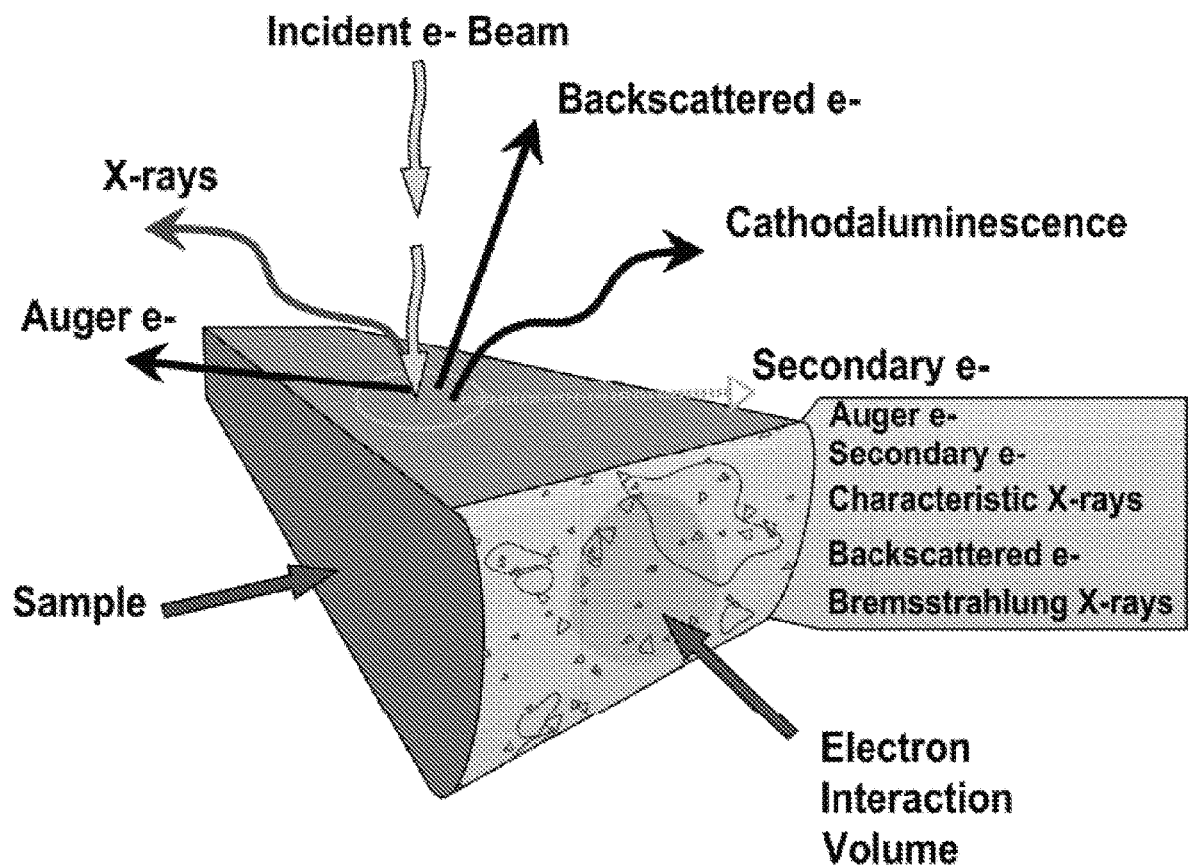
FIG. 1 is a schematic illustration showing electron interaction volume within an epoxy resin embedded sample.

The present invention can be understood more readily by reference to the following detailed description, examples, drawings, and claims, and their previous and following description. However, before the present assemblies, systems, and/or methods are disclosed and described, it is to be understood that this invention is not limited to the specific or exemplary aspects of assemblies, systems, and/or methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its best, currently known aspect. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those of ordinary skill in the pertinent art will recognize that many modifications and adaptations to the present invention are possible and can even be desirable in certain circumstances and are a part of the present invention. Thus, the following description is again provided as illustrative of the principles of the present invention and not in limitation thereof.

Definitions

As used in this application and the claims, the singular forms "a," "an," and "the" include the plural forms unless the context clearly dictates otherwise. Thus, for example, a reference to a "reel" includes aspects having two or more such reels unless the context clearly indicates otherwise.

It is appreciated that certain features of the disclosure, which are, for clarity, described in the context of separate aspects, can also be provided in combination in a single aspect. Conversely, various features of the disclosure, which are, for brevity, described in the context of a single aspect, can also be provided separately or in any suitable combination.

As used herein, the terms "optional" or "optionally" mean that the subsequently described event or circumstance can or cannot occur and that the description includes instances where said event or circumstance occurs and instances where it does not.

It is also to be understood that the terminology used herein is for the purpose of describing particular aspects only and is not intended to be limiting. As used in the specification and the claims, the term "comprising" can include aspects of "consisting of" and "consisting essentially of." Additionally, the term "includes" means "comprises."

For the terms "for example" and "such as," and grammatical equivalences thereof, the phrase "and without limitation" is understood to follow unless explicitly stated otherwise.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Furthermore, when numerical ranges of varying scope are set forth herein, it is contemplated that any combination of these values inclusive of the recited values can be used. Further, ranges can be expressed herein as from "about" one particular value, and/or to "about" another particular value. When such a range is expressed, another aspect includes from the one particular value and/or to the other particular value.

Similarly, when values are expressed as approximations, by use of the antecedent "about," it will be understood that the particular value forms another aspect. It will be further understood that the endpoints of each of the ranges are significant both in relation to the other endpoint and independently of the other endpoint. Unless stated otherwise, the term "about" means within 5% (e.g., within 2% or 1%) of the particular value modified by the term "about."

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 2, 2.7, 3, 4, 5, 5.3, 6 and any whole and partial increments therebetween. This applies regardless of the breadth of the range.

As used herein, the term "substantially" means that the subsequently described event or circumstance completely occurs or that the subsequently described event or circumstance generally, typically, or approximately occurs.

Further, the terms "coupled" and "associated" generally means electrically, electromagnetically, and/or physically (e.g., mechanically or chemically) coupled or linked and does not exclude the presence of intermediate elements between the coupled or associated items.

It will be understood that, although the terms "first," "second," etc. can be used herein to describe various elements, components, regions, layers and/or sections. These elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example aspects.

Spatially relative terms, such as "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

Numerous other general purpose or special purpose computing devices environments or configurations can be used. Examples of well-known computing devices, environments, and/or configurations that can be suitable for use include, but are not limited to, personal computers, server computers, handheld or laptop devices, multiprocessor systems, microprocessor-based systems, network personal computers (PCs), minicomputers, mainframe computers, embedded systems, distributed computing environments that include any of the above systems or devices, and the like.

Computer-executable instructions, such as program modules, being executed by a computer, can be used. Generally, program modules include routines, programs, objects, components, data structures, etc. that perform particular tasks or implement particular abstract data types. Distributed computing environments can be used where tasks are performed by remote processing devices that are linked through a communications network or other data transmission medium. In a distributed computing environment, program modules and other data can be located in both local and remote computer storage media, including memory storage devices.

In its most basic configuration, a computing device typically includes at least one processing unit and memory. Depending on the exact configuration and type of computing device, memory can be volatile (such as random-access memory (RAM)), non-volatile (such as read-only memory (ROM), flash memory, etc.), or some combination of the two.

Computing devices can have additional features/functionality. For example, a computing device can include additional storage (removable and/or non-removable) including, but not limited to, magnetic or optical disks or tape.

Computing device typically includes a variety of computer-readable media. Computer-readable media can be any available media that can be accessed by the device and includes both volatile and non-volatile media, removable and non-removable media.

Computer storage media include volatile and non-volatile, and removable and non-removable media implemented in any method or technology for storage of information such as computer-readable instructions, data structures, program modules or other data. Memory, removable storage, and non-removable storage are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device. Any such computer storage media can be part of a computing device.

Computing devices, as disclosed herein, can contain communication connection(s) that allow the device to communicate with other devices. Computing devices can also have input device(s) such as a keyboard, mouse, pen, voice input device, touch input device, etc. Output device(s) such as a display, speakers, printer, etc. can also be included. All these devices are well known in the art and need not be discussed at length here.

It should be understood that the various techniques described herein can be implemented in connection with hardware components or software components or, where appropriate, with a combination of both. Illustrative types of hardware components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The methods and apparatus of the presently disclosed subject matter, or certain aspects or portions thereof, can take the form of program code (i.e., instructions) embodied in tangible media, such as CD-ROMs, hard drives, or any other machine-readable storage medium where, when the program code is loaded into and executed by a machine, such as a computer, the machine becomes an apparatus for practicing the presently disclosed subject matter.

Although the operations of exemplary aspects of the disclosed method can be described in a particular, sequential order for convenient presentation, it should be understood that disclosed aspects can encompass an order of operations other than the particular, sequential order disclosed. For example, operations described sequentially can, in some cases, be rearranged or performed concurrently. Further, descriptions and disclosures provided in association with one particular aspect are not limited to that aspect and can be applied to any aspect disclosed.

While aspects of the present invention can be described and claimed in a particular statutory class, such as the system statutory class, this is for convenience only, and one of ordinary skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred in any respect. This holds for any possible non-express basis for interpretation, including matters of logic with respect to arrangement of steps or operational flow, plain meaning derived from grammatical organization or punctuation, or the number or type of aspects described in the specification.

Moreover, for the sake of simplicity, the attached figures cannot show the various ways (readily discernable, based on this disclosure, by one of ordinary skill in the art) in which the disclosed system, method, and apparatus can be used in combination with other systems, methods, and apparatuses. Additionally, the description sometimes uses terms such as "produce" and "provide" to describe the disclosed method. These terms are high-level abstractions of the actual operations that can be performed. The actual operations that correspond to these terms can vary depending on the particular implementation and are, based on this disclosure, readily discernible by one of ordinary skill in the art.

The present invention can be understood more readily by reference to the following detailed description of various aspects of the invention and the examples included therein and to the Figures and their previous and following description.

Assemblies and Systems

This disclosure describes an economical, compact device and system developed under the acronym "STAR," which stands for "Scanning Transmission, Arraytome, Reel-to-Reel Microscopy." Generally, this is a microscopy system that accommodates sample preparation with a commercial microtome and numerous specialized attachment accessories and tools that adapt the microtome for more efficient sample delivery and a direct transfer of the prepared samples to an electron microscope system for imaging.

In certain aspects, the modular reel-to-reel assembly, as disclosed herein, can be referred to as a STAR electron microscope holder. While in other aspects, the systems disclosed herein can be referred to as STAR electron microscope systems.

Figure 4A:
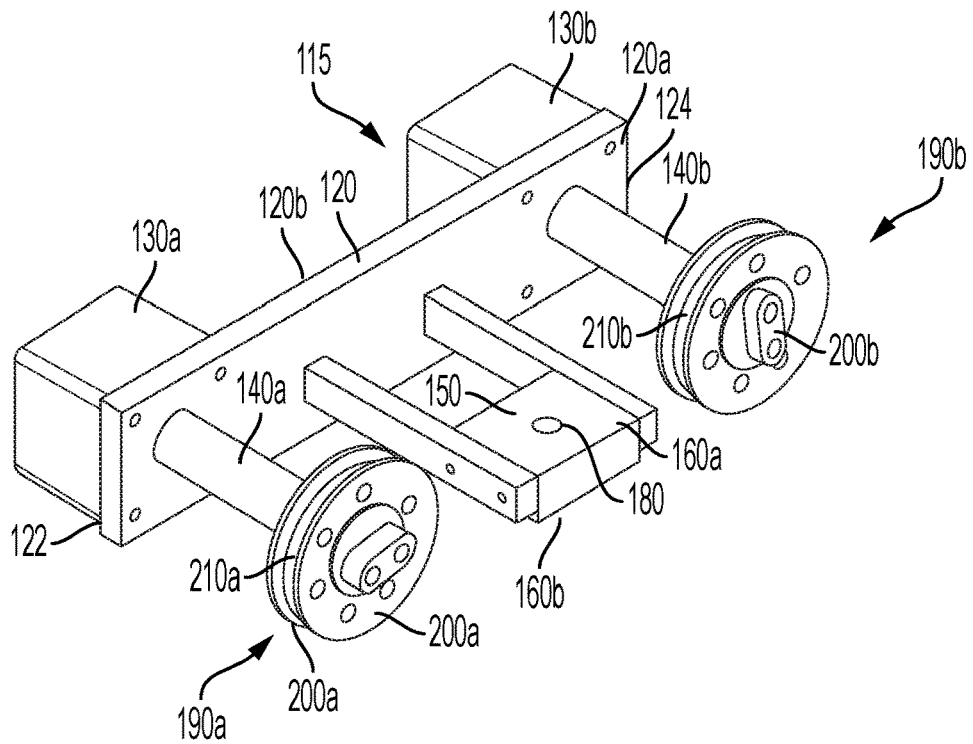
FIGS. 4A-4B depict a schematic illustration of an exemplary modular reel-to-reel assembly according to one aspect.
Figure 4B:
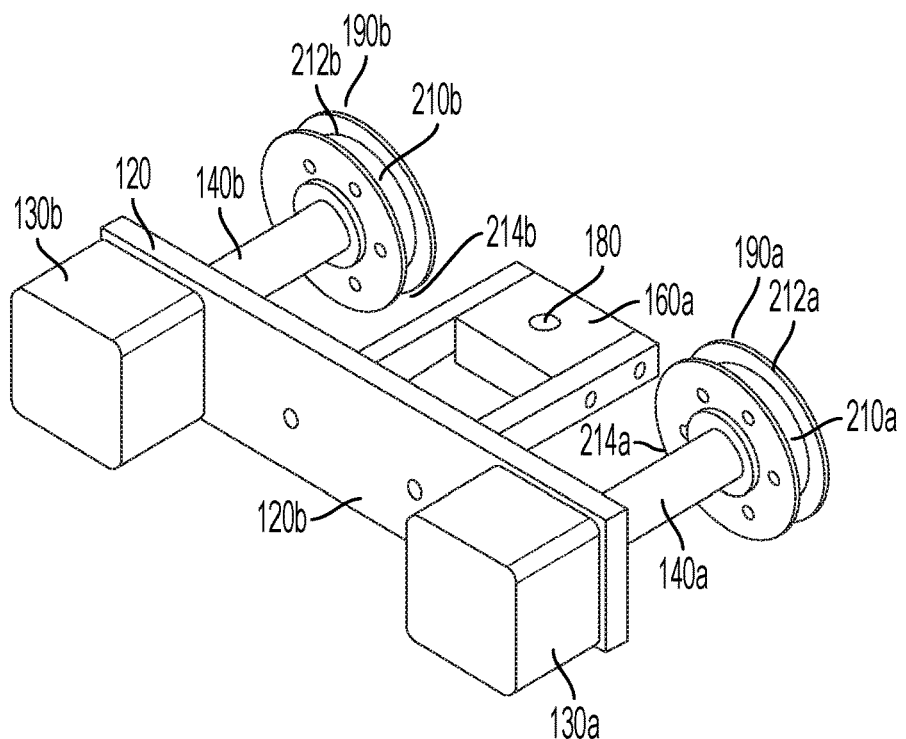

In certain aspects disclosed herein is a modular reel-to-reel assembly for an electron microscope imaging, as shown in FIGS. 4A-4B. In such aspects, the disclosed reel-to-reel assembly (also referred to as the "assembly") comprises a reel-to-reel frame (also referred to as a "frame") 115. It can be seen the frame comprises a strut 120 having a first surface 120a and an opposite second surface 120b, a first end 122 and a second end 124. Such strut 120 detachably holds: a mounting bracket 150 having a top surface 160a and a bottom surface 160b. As can be seen in this exemplary aspect, the mounting bracket 150 extends from the first surface 120a of the strut and is positioned perpendicularly to the first surface 120a of the strut 120. In still further aspects, the mounting bracket 150 comprises a first aperture 180 extending from the top surface 160a to the bottom surface 160b.

As further can be seen, the strut 120 detachably holds: a feeder motor 130a and a take-up motor 130b coupled to the second surface 120b of the strut 120 such that the feeder motor is spaced from the take-up motor by a predetermined distance. It is understood that the specific positioning of the motor can be determined by one of ordinary skill in the art and will depend on a specific application (for example, a specific model of an electron microscope, chamber size, loading method, etc.).

In still further aspects, and as shown in FIGS. 4A-4B, the strut 120 further detachably holds a first rod 140a and a second rod 140b. In certain aspects, the first rod 140a is detachably coupled with the feeder motor 130a through the strut 120, such that the first rod 140a extends from the first surface 120a of the strut 120 in parallel but opposite direction to the mounting bracket 150. It is understood, however, that the specific positioning of the feeder motor 130a, relative to the mounting bracket 150, can also be changed depending on the desired application. In still further aspects, the feeder motor 130a is configured to spin the first rod 140a at a predetermined speed. It is understood that the predetermined speed of the feeder motor 130a can be determined based on the desired application.

In still further aspects, the second rod 140b is detachably coupled with the take-up motor 130b through the strut 120, such that the second rod 140b extends from the first surface 120a of the strut 120 in parallel but opposite direction to the mounting bracket 150. It is understood, however, that the specific positioning of the take-up motor 130b relative to the mounting bracket 150 can also be changed depending on the desired application. In still further aspects, the take-up motor 130b is configured to spin the second rod 140b at a predetermined speed. It is understood that the predetermined speed of the take-up motor 130b can be determined based on the desired application.

In still further aspects, it is understood that the predetermined speed for rotating the first rod can be the same or different as the predetermined speed of rotating the second rod. In certain and unlimiting aspects, the predetermined speed for rotating the first rod can be faster than the predetermined speed of rotating the second rod. Yet in still further aspects, the predetermined speed for rotating the first rod can be slower than the predetermined speed of rotating the second rod. While in still further aspects, the predetermined speed for rotating the first rod is substantially the same as the predetermined speed of rotating the second rod.

In yet further aspects, the strut 120 detachably holds a feeder reel 190a having a top portion 212a and a bottom portion 214a that is detachably and rotatably coupled to the first rod 140a. Further, the strut 120 also detachably holds a take-up reel 190b having a top portion 212b and a bottom portion 214b and wherein the take-up reel is detachably and rotatably coupled to the second rod 140b. In still further aspects, the feeder reel and the take-up reel, each comprises two wheels 200a and 200b connected with a spool 210a and 210b respectively, wherein each spool (sometimes referred to as a hub) is adapted for receiving and relaying the sample-containing tape (not shown).

In still further aspects, the wheels of the reel and the spool can be made of any material that can be adapted for use in an electron microscope and/or high vacuum. In certain and unlimited aspects, the wheels can comprise any materials that have predetermined conductivity and predetermined magnetically shielding properties. In yet further exemplary aspects, each of the two wheels and the spool can comprise aluminum and/or aluminum alloy having predetermined conductivity and predetermined magnetically shielding properties. It is understood that the materials used herein exhibit shielding against magnetic fields. In still further aspects, however, that aluminum and aluminum alloys are only exemplary materials and other materials can be used. For example, and without limitation, each of the two wheels and the spool can comprise one or more of carbon, copper, chromium, brass, iron, molybdenum, nickel, stainless steel, titanium alloys.

In still further aspects, each part of the disclosed herein assembly can be made by any known in the art methods. In one aspect, each of the parts of the disclosed herein assembly could be made by precise machining of the desired materials. However, in yet other aspects, each or any part of the disclosed herein assembly can be done by 3D printing.

In yet further aspects, it is understood that the strut, the first and the second rod, the mounting bracket, the reels are made of the same material. In still further aspects, the material can be any material that can be adapted for use in an electron microscope and/or high vacuum. In still further aspects, the material can comprise aluminum and/or aluminum alloy having predetermined conductivity and predetermined magnetically shielding properties. In still further aspects, the mounting bracket comprises aluminum and/or aluminum alloy having predetermined conductivity and predetermined magnetically shielding properties. In still further aspects, the first and the second rod comprise aluminum and/or aluminum alloy having predetermined conductivity and predetermined magnetically shielding properties. In yet further aspects, the strut comprises aluminum and/or aluminum alloy having predetermined conductivity and predetermined magnetically shielding properties. In yet further aspects, the motors can be covered with a mu-metal shell. It is understood that the mu-metal shell can comprise a nickel-iron soft ferromagnetic alloy having high permeability. In such aspects, the use of a mu-metal shell allows shielding of the motor's circuitry against magnetic fields and X-rays.

It is further understood that each part of the disclosed herein assembly is produced from materials and compositions are capable of withstanding temperatures inside of in-situ electron microscopes that are equipped to use a reel-to-reel imaging system. Such temperatures in the environment of an electron microscope can be in the range up to about 1,500° C., including exemplary values of about 900° C., about 1,000° C., about 1,100° C., about 1,200° C., about 1,300° C., and about 1,400° C. to the range of 1400 degrees Celsius to 1500 degrees Celsius.

In still further aspects, each of the wheels and the spool that are comprising disclosed herein reels have a calibrated circumference produced by precise machining of the desired materials, such as, for example, and without limitation, aluminum and aluminum alloy. In yet further aspects, these parts can be produced by precise machining of other materials, such as carbon, copper, chromium, brass, iron, molybdenum, nickel, stainless steel, titanium alloys. In still further aspects, the reels are adapted to maintain the first speed and the second speed such that the sample-containing tape can extend with tension, when desired, between the feeder reel and the take-up reel.

In yet further aspects, the feeder reel 190a is configured to relay a sample-containing tape (not shown) to the take-up reel 190b at a first speed, and wherein the reel-to-reel assembly is adapted for use in an electron microscope chamber. In still further aspects, the take-up reel is configured to send the sample-containing tape back to the feeder reel at a second speed. It is understood that the first speed for the feeder reel can be the same or different as the second speed of the take-up reel. In certain aspects and without limitation, the first and the second speeds can be up to about 4,000 rpm. In yet further aspects, the first and the second speed can be in any range between about 100 rpm and about 4,000 rpm, including exemplary values of about 250 rpm, about 500 rpm, about 750 rpm, about 1,000 rpm, about 1,250 rpm, about 1,500 rpm, about 1,750 rpm, about 2,000 rpm, about 2,250 rpm, about 2,500 rpm, about 2,750 rpm, about 3,000 rpm, about 3,250 rpm, about 3,500 rpm, and about 3,750 rpm.

Still, in still further aspects, the first speed can be faster than the second speed. Yet in still further aspects, the first speed can be slower than the second speed. While in still further aspects, the first speed is substantially the same as the second speed. In still further aspects, the first speed can be substantially the same, slightly different, or different as compared to the predetermined speed for rotating the first rod. In still further aspects, the second speed can be substantially the same, slightly different, or different as compared to the predetermined speed for rotating the second rod. In yet further aspects, each speed described herein can be precisely controlled such that the same speed can be reproduced at any point in the imaging process if desired.

In still further aspects, and as shown in FIGS. 5-6, the assembly disclosed herein comprises a sampling platform 220 comprising a top surface 220a and a bottom surface, opposite to the top surface (not shown). In such aspects, the bottom surface of the sampling platform 220 is configured to be detachably attached to the top surface 160a of the mounting bracket 150. In yet other aspects, the top surface 220a of the sampling platform is configured to receive the sample-containing tape as it is relayed from the feeder reel to the take-up reel or from the take-up reel to the feeder reel.

In yet further aspects, the sample-containing tape is received with tension across the top surface 220a of the sampling platform 220. It is understood that the sample-containing tape remains substantially flat as it relayed from the feeder reel to the take-up reel and during the electron microscope imagining.

In yet further aspects, the top surface 220a of the sampling platform 220 can comprise a groove 240. The groove is configured to receive the sampling-containing tape. In such aspects, again, it is understood that the sample-containing tape is received with a tension within the groove to allow the tape to remain substantially flat and within the precise positioning during the imaging process.

In still further aspects, the sampling platform comprises a second aperture 260 extending through the sampling platform from the top surface to the bottom surface of the platform. In such exemplary aspects, the bottom surface of the sampling platform overlies the mounting bracket such that the first aperture 180 and the second aperture 260 are substantially aligned. It is understood, however, that while the first and the second apertures are substantially aligned, there is no requirement for those apertures to have the same diameter. In such exemplary and unlimiting aspects, the centers of each of the apertures are aligned. In some aspects, the second aperture 260 can be larger than the first aperture 180. While in yet other aspects, the second apertures 260 can be smaller than the first aperture 180. Also, it is understood that the diameter of the first and/or the second aperture at the top surface of the mounting bracket and/or the sampling platform, respectively, can be the same or different from the diameter of the first and/or the second aperture at the bottom surface of the mounting bracket and/or the sampling platform. In still further aspects, it is understood that the specific location of each aperture on the sampling platform and the mounting can be chosen by one of ordinary skill in the art depending on the specific application, an electron microscope model, and types of the detectors in use. It is further understood that disclosed herein are aspects, where none or only some of the apertures are present. In such aspects, for example, the mounting bracket can comprise the first aperture, while the sampling platform does not comprise any apertures at all. Also disclosed are aspects where neither mounting bracket nor the sampling platform comprises apertures.

Figure 6A:
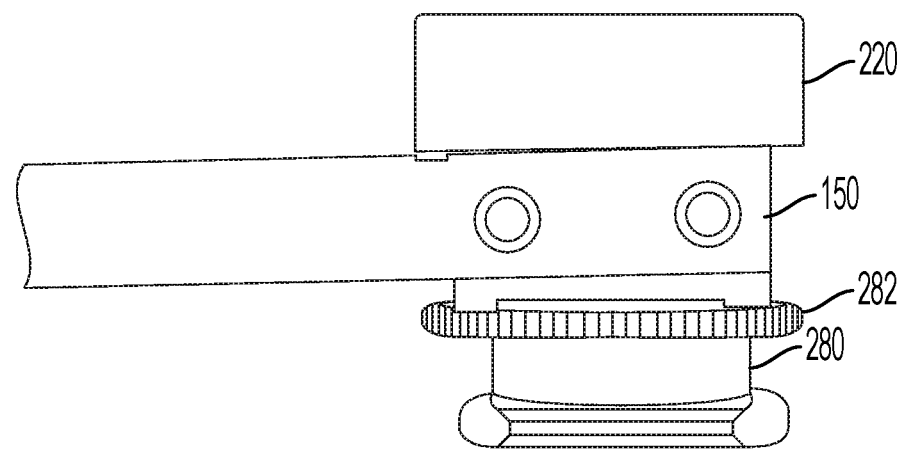
FIGS. 6A-6D depict a schematic illustration of an exemplary modular reel-to-reel assembly according to one aspect.
Figure 6B:
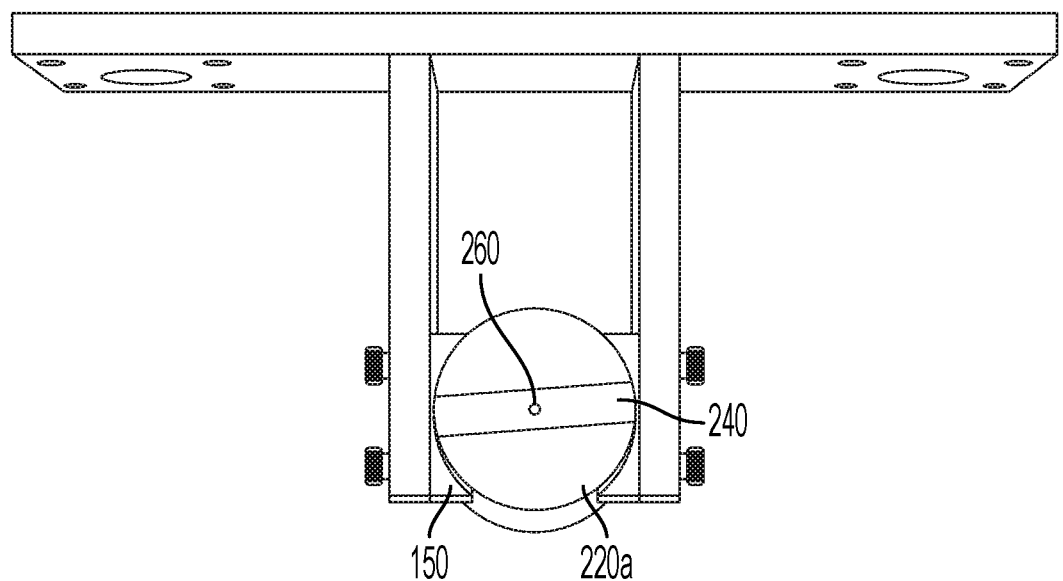
Figure 6C:
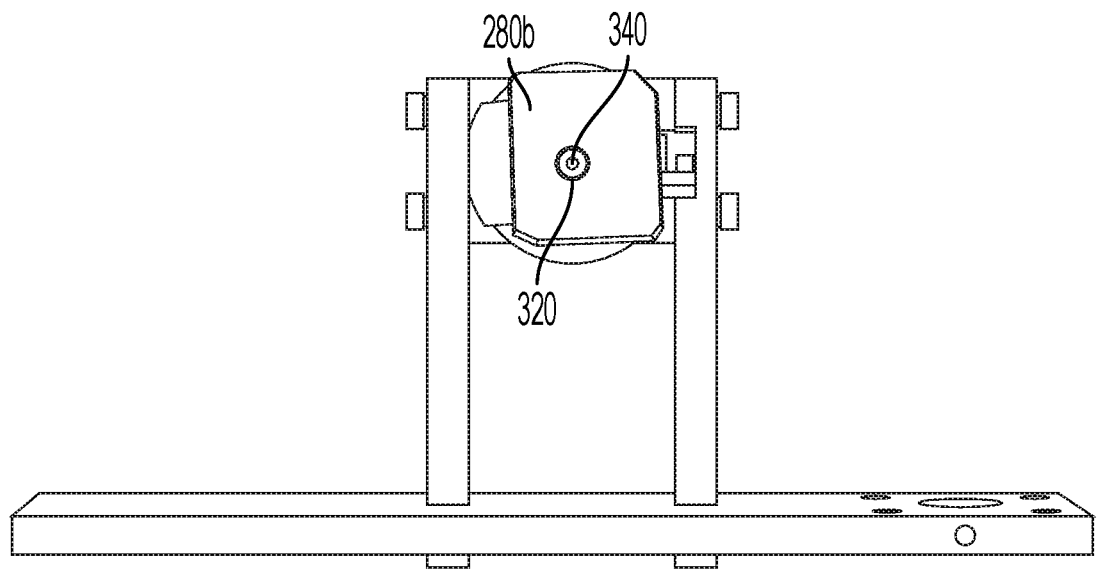
Figure 6D:
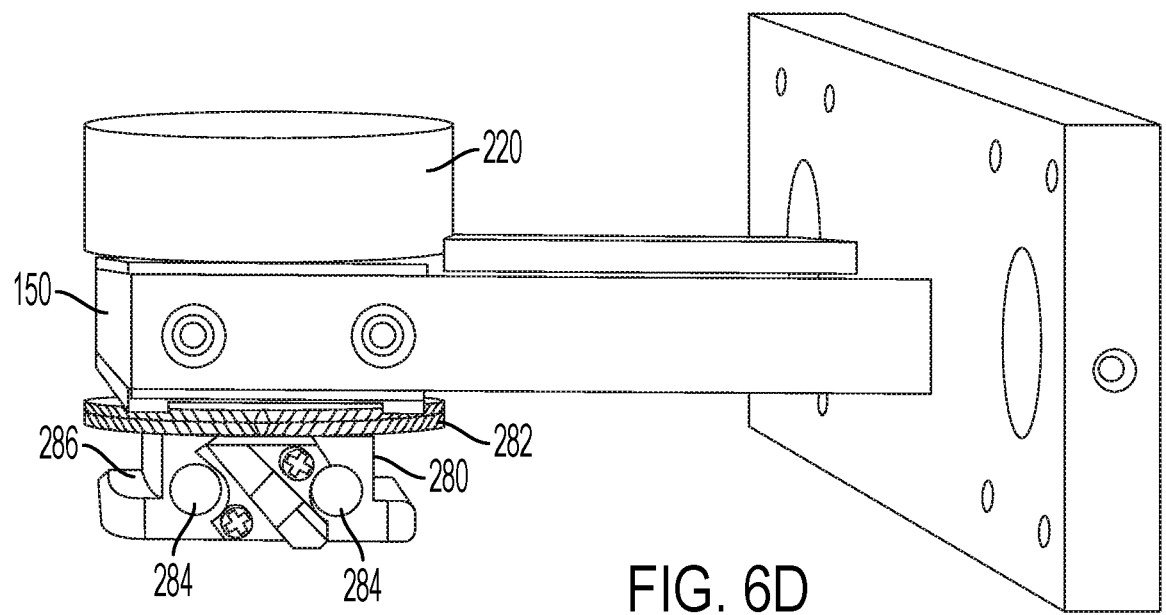
Figure 7:
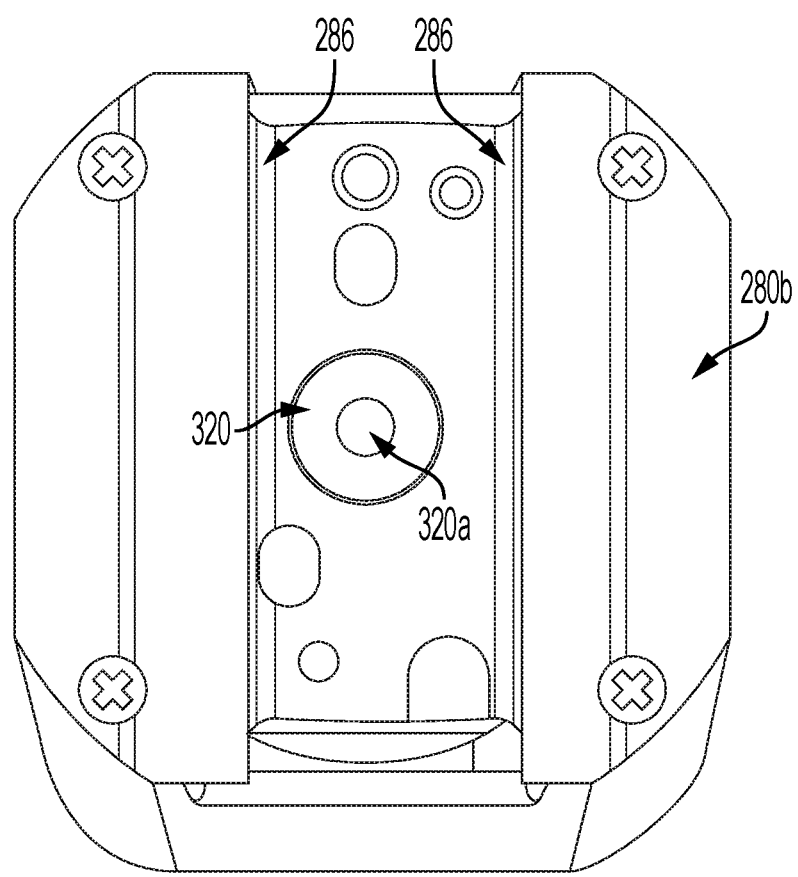
FIG. 7 depicts a schematic illustration of an exemplary modular reel-to-reel assembly according to one aspect.
Figure 9:
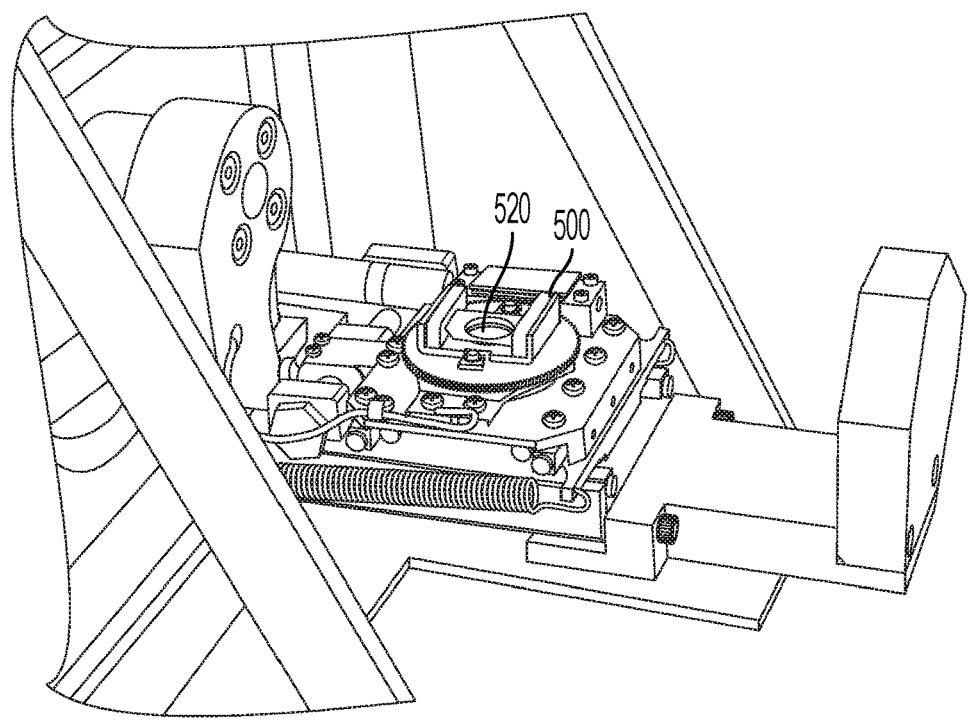
FIG. 9 depicts a schematic illustration of an exemplary electron microscope stage according to one aspect.

In still further aspects, the bottom surface 160b of the mounting bracket is adapted to connect the reel-to-reel frame to an electron-microscope-stage-engaging platform 280 (FIGS. 5-7). The electron-microscope-stage-engaging platform 280 can be any platform that can be used to matebly mount the whole assembly to the stage within the electron microscope. In some exemplary aspects, such an electron-microscope-stage-engaging platform can be referred to as T-base. In certain exemplary aspects, the T-base or the electron-microscope-stage-engaging platform, as disclosed herein, can be used, for example, and without limitation, with any of the following scanning electron microscopes Hitachi's SU8000 series, SU8200 series, SU6600, SU-4700 and S-4800 FE-SEMs. In still further aspects, and as shown in the figures that electron-microscope-state-engaging platform 280 can comprise dovetails 286 on each side of the platform that allows the platform to slidably mount the assembly on the electron microscope stage. The exemplary and unlimiting microscope stage 500 is shown in FIG. 9. Such an exemplary stage 500 is configured to slidably engage with the electron-microscope-stage-engaging platform 280 and to mount the assembly with the electron scope chamber. In still further aspects, the stage 500, as shown in FIG. 9, can comprise an opening 520.

Figure 5A:
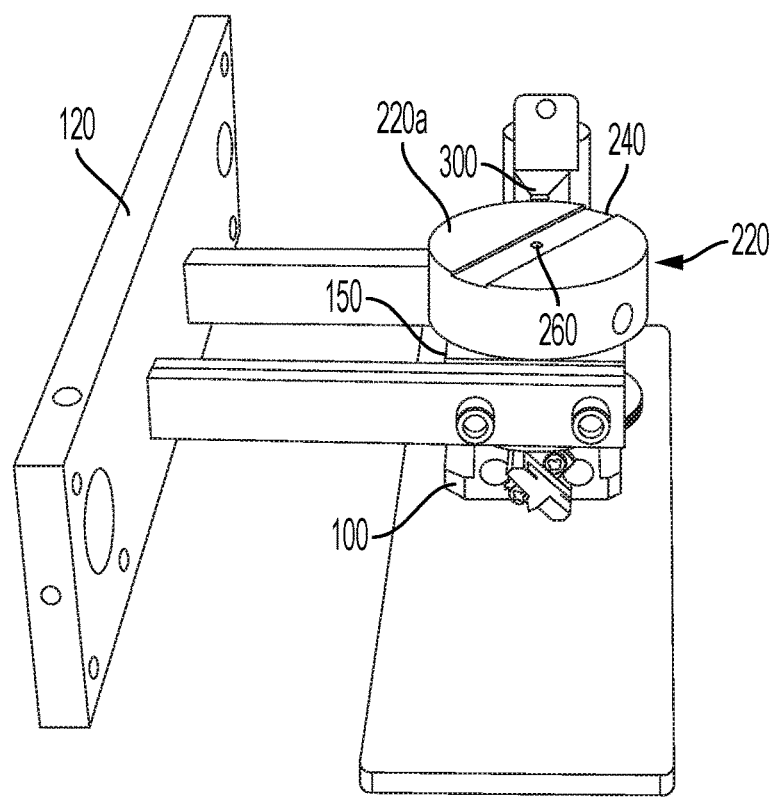
FIGS. 5A-5B depict a schematic illustration of an exemplary modular reel-to-reel assembly according to one aspect.
Figure 5B:
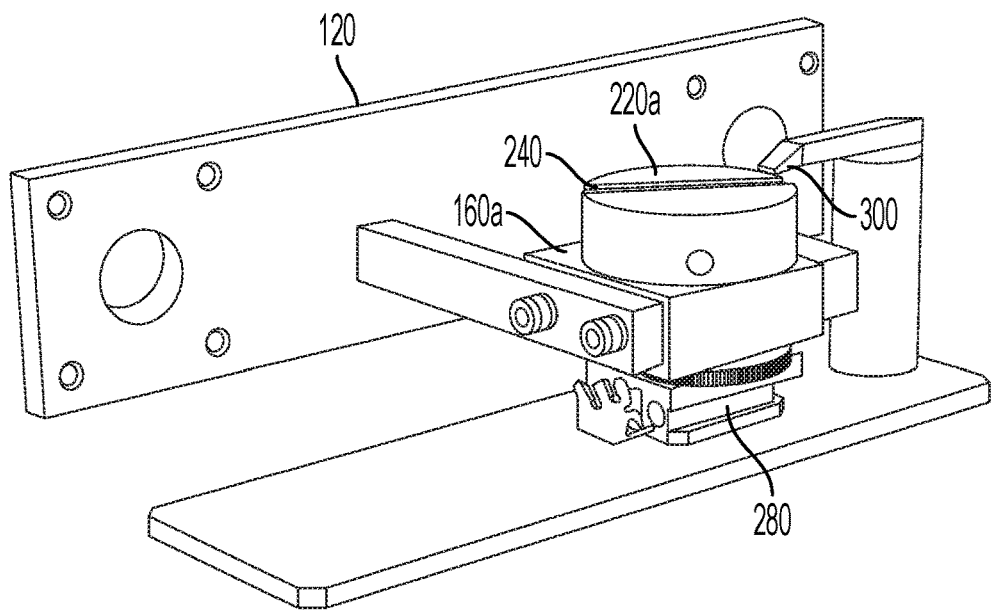

It is understood that the height of the assembly comprising the mounting bracket 150, the sampling platform 220 and the electron-microscope-stage-engaging platform 280 can be monitored as it affects the positioning of the whole assembly within the chamber. In such aspects, a tool 300 configured to measure the height of the assembly can be used prior to loading the assembly into the electron microscope chamber (FIGS. 5A-5B).

In yet further aspects and as described herein the electron-microscope-stage-engaging platform 280 (or T-base) has a third aperture 320 (FIG. 6C, for example) aligned with the first aperture 180 and the second aperture 260, and wherein the electron-microscope-stage engaging platform 280 is adapted to slidably connect with an electron microscope stage 500 positioned in an electron microscope chamber.

In still further aspects, the first 180, the second 260, and third apertures 320 are substantially aligned with each other. In yet further aspects, all three apertures are substantially aligned with the opening 520 in the electron microscope stage 500. It is, however, understood that while the first 180, the second 260, and third apertures 320 are substantially aligned, there is no requirement for those apertures to have the same diameter. In such exemplary and unlimiting aspects, the centers of each of the apertures are aligned. In still further aspects, the center of each of the apertures is also aligned with the opening 520 on the electron microscope stage 500. In some aspects, the second aperture and/or third aperture is larger than the first aperture, while in yet other aspects, the second aperture and/or the third aperture is smaller than the first aperture.

Similarly, the first aperture and/or third aperture is larger than the second aperture, while in yet other aspects, the first aperture and/or the third aperture is smaller than the second aperture. Or in yet other aspects, it is also possible that the first aperture and/or second aperture is larger than the third aperture, while in yet other aspects, the first apertures and/or the second aperture is smaller the third aperture. Also, it is understood that the diameter of the first the second, and/or the third aperture at the top surface of the mounting bracket, the sampling platform, and/or, the electron-microscope-stage engaging platform respectively, can be the same or different from the diameter of the second, and/or the third aperture at the bottom surface of the mounting bracket, the sampling platform, and/or the electron-microscope-stage engaging platform.

Also disclosed herein are aspects where the use of specific detectors requires the third aperture 320 to be larger than the second 260 and/or the first apertures 180. In such aspects, which are disclosed in detail below, the diameter of the third aperture 320 at the bottom of the electron-microscope-stage engaging platform can be larger than the third aperture 320a at the top of the electron-microscope-stage engaging platform (FIG. 7). While in still further aspects, the diameter of the third aperture at the bottom of the electron-microscope-stage engaging platform is substantially the same as the diameter of the third aperture at the top of the electron-microscope-stage engaging platform.

It is understood that the first, second, and third apertures as disclosed herein allow electrons or other signals to pass through the sample-containing tape to a signal detector that can be situated below assembly and stage. Alternatively, where the signal detector is situated above, these apertures allow confining transmitted electrons so that only electrons reflected from the sample-containing tape are detected.

In still further aspects, the sampling platform and the electron-microscope-stage-engaging platform are detachably connected to the mounting bracket with a fastener 340. It is understood that any fastener can be utilized. In some aspects, the fastener can be a screw, a bolt, or any other fastener known in the art. In certain aspects, the fastener 340 detachably connects the sampling platform 220, the mounting bracket 150, and the electron-microscope-stage-engaging platform 280 through the first 180, the second 260 and the third apertures 320. In certain aspects, the fastener 340 can have a hollow cylindrical form and is positioned within the first, second, and third apertures. It is also understood that the fastener can fully extend through the first and the third apertures, while only partially extending through the second aperture. In such an exemplary aspect, the fastener may or may not extend up to a second aperture's opening on the top surface of the sampling platform. In yet further aspects, the fastener is a hollow screw that having a predetermined diameter that is compatible with the first, second, and the third apertures. In still further aspects, the assembly can comprise a locking nut 282 that is configured to detachably connect the electron-microscope-stage-engaging platform 280 with the bracket 150 (FIG. 6D).

In still further aspects, the sample-containing tape is relayed from the bottom portion 214a of the feeder reel 190a to the sampling platform 220 and to the bottom portion 214b of the take-up reel 190b. In such aspects, the sample-containing tape is positioned on the top surface 220a of the sampling platform 220 above the second aperture 260 with tension, again, to ensure that the sample-containing tape is substantially flat and stationary during the imaging. In yet some exemplary and unlimiting aspects, the sample-containing tape is positioned within the groove 240 and above the second aperture 260. It is understood that the term "stationary," as used above, describes a specific state of the tape during the imaging steps, when motors are not spinning the rods and when reels do not move.

In yet further aspects, the sample-containing tape can also be relayed from the bottom portion 214b of the take-up reel 190b to the sampling platform 220 and to the bottom portion 214a of the feeder reel 190a. In such aspects, the sample-containing tape moves backward from the take-up reel 190b towards the feeder reel 190a.

It is understood that any tapes that have the desired conductivity can be used as sample-containing tapes. In certain aspects, the tapes used herein comprise graphene. In such exemplary and unlimiting aspects, graphene can uniformly coat one side of a 0.5-mil Polyimide Kapton Film (No Additional Adhesive) 6.4 mm [¼ inch] wide×33 m [36 yds] long (PIT0.5N/6.4). It is understood that the electrical conductivity of the tape can be controlled by controlling the graphene coating's thickness, ranging from tens of nanometers to hundreds of nanometers. Typically, for about 5-10 nm thickness of the graphene film, a sheet resistance of less than 45 ohm/square can be achieved. In still further aspects, a special conductive fixation can also be used to provide the tape with the desired properties. Additional examples of various tapes that can be used as the sample-containing tapes are described in the co-pending and commonly owned patents, such as an International PCT Application Serial No. PCT/US2019/013051, "Conductive Fixation of Organic Material," filed Jan. 10, 2018, and PCT Application Serial No. PCT US2019/065633, "Graphene Based Substrates for Imaging," filed Dec. 11, 2019, the contents of which are incorporated herein in their whole entireties.

It is further understood that the sample-containing tapes are prepared by slicing the samples with an ultramicrotome on the tape to form a plurality of ultramicrotome samples. In certain aspects, the plurality of ultramicrotome samples comprise resin-based microscopic sections of cells and tissues that were sliced and positioned on the tape. The sample-containing tape can comprise thousands of ultra-thin (thickness of 50 nm or less) and/or semi-thin (thickness above 50 nm) sample sections that are automatically and continuously collected from a diamond knife edge onto a graphene-based, or other specialized material, surface. In some non-limiting aspects, the sample collection surfaces can include coated 0.5-mil Polyimide [Kapton] Film No Adhesive 6.4 mm [¼"] wide×33 m [36 yd] long (PIT0.5N/6.4). In yet further aspects, the samples obtained by ultramicrotome and disposed on the tape can be further manipulated as desired before imaging with an electron microscope. In still further aspects, the sample-containing tape can comprise any other samples, for example, such that can be prepared by focused ion beam milling (FIB), etc.

As discussed in detail above, the sample-containing tape then is sufficiently pliable to wind around spools 210a and 210b of the feeder reel 190a and the take-up reel 190b at a desirable tension between the reels.

In still further aspects, the feeder reel and the take-up reel that can be detachably attached to the frame disclosed above are also adapted to connect with an ultramicrotome. In such aspects, the reels are first used with an ultramicrotome device, and then the prepared samples winded around the spools are transferred to the disclosed herein assembly for use with the microscope.

The specific use of the feeder reel and the take-up reel for ultramicrotome procedures are further disclosed in the co-pending and commonly owned patents, such as U.S. Provisional Application No. 62/883,496, filed on Aug. 6, 2019; U.S. Provisional Application No. 62/883,918, filed on Aug. 7, 2019, and U.S. Provisional Application No. 62/891,067, filed on Aug. 23, 2019, the contents of which are incorporated herein in their whole entireties.

In still further aspects, the assembly is detachably attached to a control unit. In some aspects, the control unit is configured to control the predetermined speed of the feeder motor and the predetermined speed of the take-up motor. While in yet other aspects, the control unit is configured to identify the positioning of each of the plurality of ultramicrotome samples on the sample-containing tape. In yet further aspects, the control unit is configured to rotate the feeder reel and the take-up reel to a predetermined position such that a predetermined sample of the plurality of ultramicrotome samples is imaged.

It is further understood that the control unit used herein can also be used to obtain the plurality of ultramicrotome samples on the sample-containing tape. In such aspects, the same control unit is used for ultramicrotome and imaging.

In certain aspects, the control unit is in electrical communication with the motors of the assembly and with the stage of the assembly. In certain aspects, the control unit can be equipped to control the respective speed of the feeder motor and the take-up motor and to adjust those speeds according to a sample positioning.

The control unit can further comprise a graphical user interface. Such an interface can be configured to receive data entry for programming the control unit. The data entry can comprise programming of the optional parameters to maintain variables such as speed selections for the feeder motor 130a and the take-up motor 130b. It is understood that any motors that can achieve the desired function can be used. In some aspects, the motors can be stepper motors.

The control unit can be characterized as having general-purpose inputs and outputs that are connected to appropriate processors, computerized memory, and hardware that is appropriate for customized machine logical operations. In one non-limiting example, the control unit can receive data from a system of sensors, for example, during the ultramicrotome procedures, the control unit can receive data from a first cantilever arm position sensor and a second cantilever arm position sensor, either of which can be located on the cantilever arm and/or the body of the ultramicrotome. This data, along with speed data for the motors, can be used for numerous control systems programmed into the control unit. For example, in one aspect, by using the speed of the motors and the rotation speed of the reels, along with dimensions of the tape and linear speed of the tape, the control unit is adapted to track position coordinates of each cut resin section that is located on the tape. In this way, the control unit can comprise a computer registry or database that allows for tracking where a specimen is located along the tape and which sections of the tape are empty. In such aspects, the control unit allows imaging of a predetermined sample of the plurality of ultramicrotome samples. In yet further aspects, the control unit can allow sequential imaging of the sample, or it can allow the user to skip any sample by moving the tape to arrive at the desired sample location.

The control unit, as described herein, allows movement of the sample-containing tape from the feeder reel to a take-up reel. In certain aspects, the control unit can include a computer processor connected to computerized memory storing computer-implemented software implementing programmable, computerized steps of a method.

In certain aspects, the control unit needs to be manually calibrated to determine a specific position of the sample to be imaged. In such aspects, the calibrated unit can then automatically determine the position of the sample to be imaged on the sample-containing tape. In yet other aspects, the control unit does not require manual calibration. As the control unit can behave as a registry of the samples on the sample-containing tape, a user can direct the reels to the desired position. Such communication with the control unit can be done through the computer interface, for example. In still further aspects, the interface (or software) that communicates with the control unit can be further integrated with a software that directs the operation of the electron scanning microscope. In such aspects, the control unit software can be used independently or in combination with the electron microscope software.

In still further aspects, the control unit can comprise a specified firmware. In certain aspects, the control unit can comprise a firmware adapted for use with the ultramicrotome. In yet other aspects, the control unit can comprise a firmware adapted for use with an electron microscope. In yet further aspects, the control unit can comprise a firmware adapted for tape coating tools. It is understood that in some aspects, the control unit can comprise any or all of the disclosed above firmware. In still further aspects, each of the disclosed above firmware can comprise various modules configured to communicate between the control unit and a specific tool to perform the desired function.

In certain aspects, the control unit can comprise a tape control module that is configured to maintain a constant speed of the tape. In such aspects, the contact speed of tape can be controlled based on a precise diameter of the reels and their revolutions. In yet further aspects, the data related to the diameter and revolutions of the wheels can be used to control the speed of each of the feeder motor and the take-up motor In still further aspects, the tape control module can be configured to access the hardware settings of the motor controller on the board. In yet further aspects, the tape control module is configured to communicate using a transmission protocol with user software via the USB interface of the hardware.

In aspects disclosed herein, the control unit comprises an electron microscope controlling firmware. In such aspects, the firmware comprises the tape control module as disclosed. In yet further exemplary aspects, the control unit is configured to be connected with an analog joystick. In such exemplary aspects, the joystick can be configured to control the tape speed, tape direction as well as sample position during the manual mode. In certain aspects, such operation can be useful in centering the sample for imaging.

In still further aspects, the control unit is adapted to be operable with either an ultramicrotome, tape coating apparatus or an electron microscope. In certain aspects, the feeder motor can be detachably connected to an encoder. While in yet other aspects, the feeder motor is not connected to an encoder. In the aspects where no encoder is attached, a user can set an initial value for revolutions of the feeder reel and the take-up reel manually using an interface that is in communication with the control unit. In yet other aspects, where the encoder is connected to the feeder motor, only a value for revolutions of the take-up reel needs to be set. In such aspects, the control unit is configured to calculate the value for the revolution of the feeder reel automatically.

In yet further aspects, when the analog joystick is connected to the control unit, a user can use the joystick to center a first sample of the plurality of ultramicrotome samples manually with the joystick. In yet further exemplary aspects, the user can use the information collected during ultramicrotome processes to set a distance between the samples. In still further aspects, a scan time of the samples can also be set during the operation. In such aspects, the control unit is configured to pause the movement of the tape for a predetermined time to allow imaging to conclude. In still further aspects, the control unit is configured to continue the tape movement to a next sample when the scan time expires. The control unit is configured to continue this process any number of times as desired to continuously image the sample-containing tape. In yet further aspects, the control unit is configured to move the sample-containing tape back towards the feeder reel, for example, if a repeated image of a specific sample is needed In still further aspects, the sampling platform can comprise at least two electrical connectors that are in intimate contact with at least a portion of the sampling-containing tape. In some aspects, these electrical connectors can be positioned within the groove. In yet other aspects, if there is no groove present on the top surface of the platform, the electrical connector can be positioned on the top surface of the platform in intimate contact with the at least a portion of the sampling-containing tape. When the sample-containing tape is relayed from the feeder reel to the take-up reel and contact the at least two electrical connectors, the electrical connectors are configured to measure the conductivity of that portion of the sample-containing tape. The electrical connectors are in electrical communication with the control unit. In certain aspects, a four-point measurement can be used. In such aspects, the platform can comprise four electrical connectors.

It is understood, the current assembly can be used with many commercial electron microscopes, such for example, from FE-SEM of JEOL's, ZEISS's, Thermo Scientific's (previously FEI), and/or TESCAN. Since these scanning electron microscopes having various configurations, the disclosed herein assembly can be loaded (inserted) into an electron microscope by any methods known in the art. For example, the assembly can be loaded (inserted) into an electron microscope chamber by hand or with the help of the transfer rod.

Figure 3:
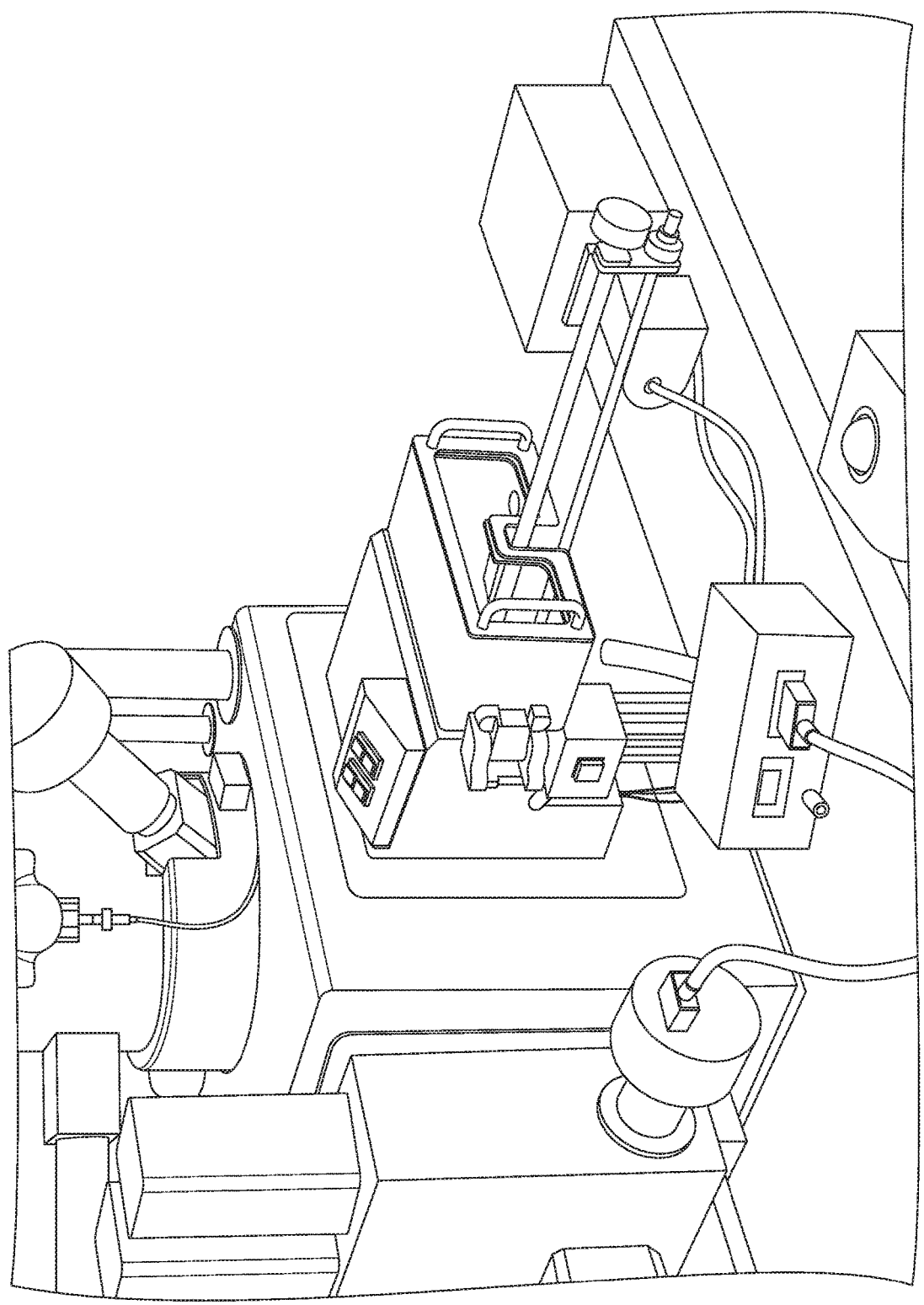
FIG. 3 is a schematic illustration of an airlock and a transfer rod of an exemplary electron microscope according to one aspect.
Figure 8:
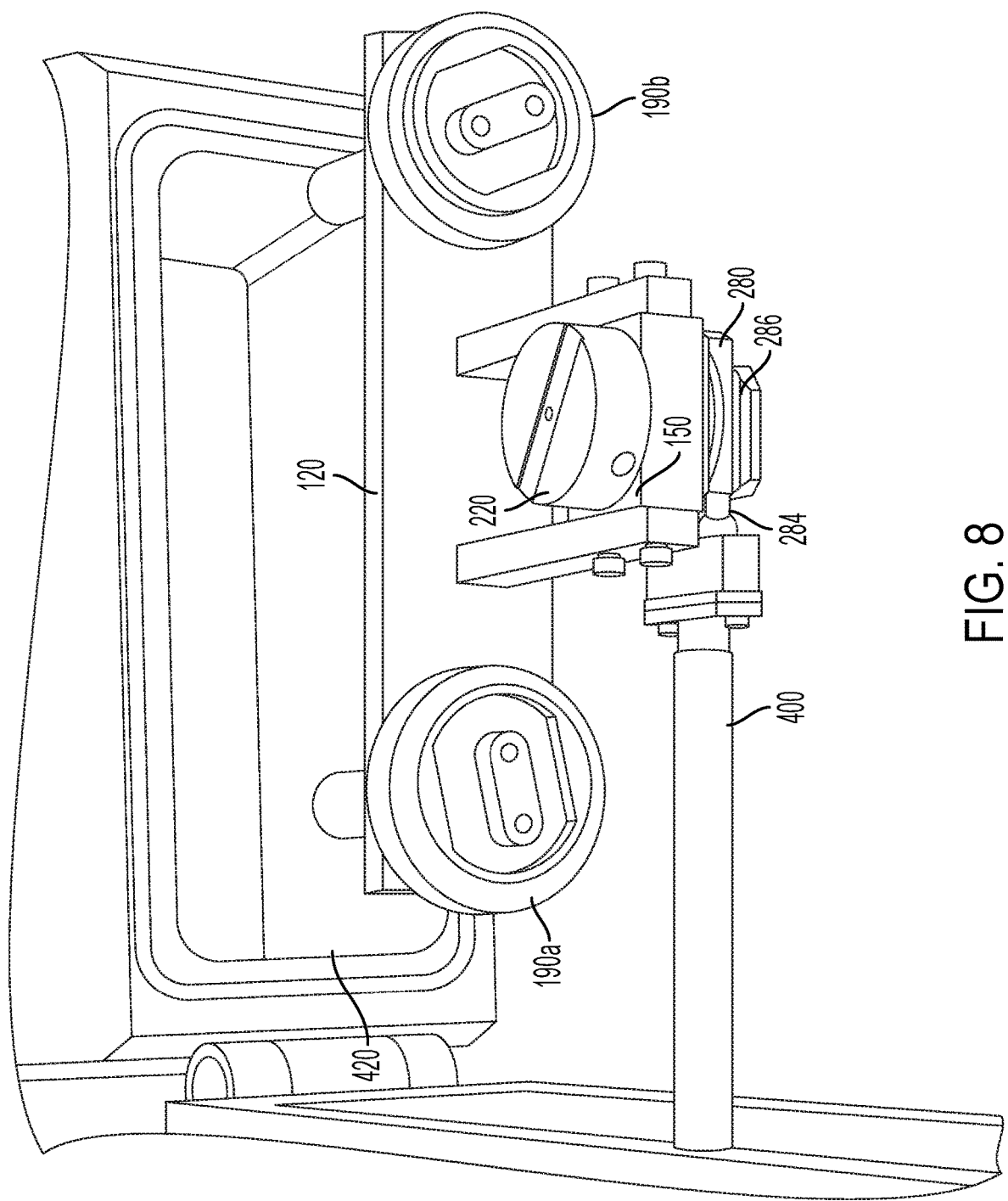
FIG. 8 depicts a schematic illustration of inserting an exemplary modular reel-to-reel assembly into an electronic microscope according to one aspect.

In some exemplary aspects, the assembly is adapted to detachably connect with at least one transfer rod 400 configured to deliver the assembly into an electron microscope chamber (FIGS. 3 and 8). In such exemplary and unlimiting aspects, the transfer rod 400 can be detachably connected to the electron-microscope-stage-engaging platform 280 through coupling means 284, as shown, for example, in FIGS. 6D, and 8. However, it is understood that the assembly can be adapted to have different connections to the transfer rod to accommodate a specific SEM model. In still further aspects, the assembly is adapted to be inserted into an electron microscope chamber through an electron microscope airlock chamber (420), as shown in FIGS. 3 and 8.

Yet, in other aspects, when the electron microscope does not comprise an airlock system (for example, as shown in FIG. 9), or due to any other restrictions, the specimen needs to be loaded directly into the chamber, the disclosed assembly is also adapted to such loading procedures. In such aspects, the scope chamber is ventilated, the assembly is mounted on the electron microscope stage, and then the chamber is vacuumed to the desired vacuum required for imaging.

Figure 10:
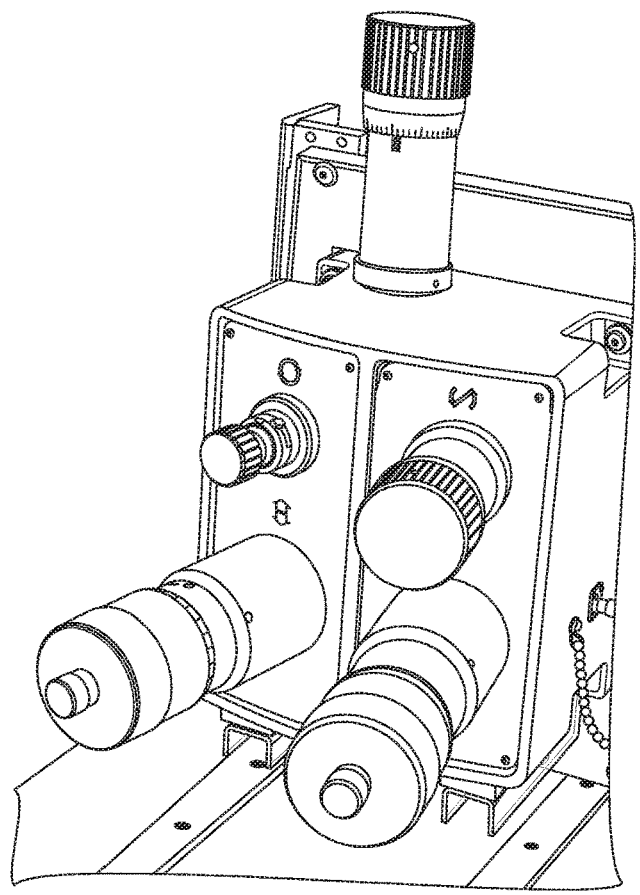
FIG. 10 depicts a schematic illustration of exemplary micro-positioning knobs controlling the movement of an exemplary modular reel-to-reel assembly within an exemplary electron microscope according to one aspect.

In still further aspects, the stage within the electron microscope can also be in electrical communication with the disclosed herein assembly. Stage can also provide translation along three orthogonal axes as well as tilt and rotation. In such aspects, the assembly is adapted to be tilted, rotated and/or moved in x, y, and/or z directions when is positioned within an electron microscope chamber. In certain exemplary and unlimiting aspects, and as shown in FIG. 10 the translation along the axes, tilting, and/or rotating can be done manually with micro-positioning valves. Yet in other aspects, the translation along the axes, tilting, and/or rotating can be done automatically with the electron microscope software and specially designed motors.

Figure 2:
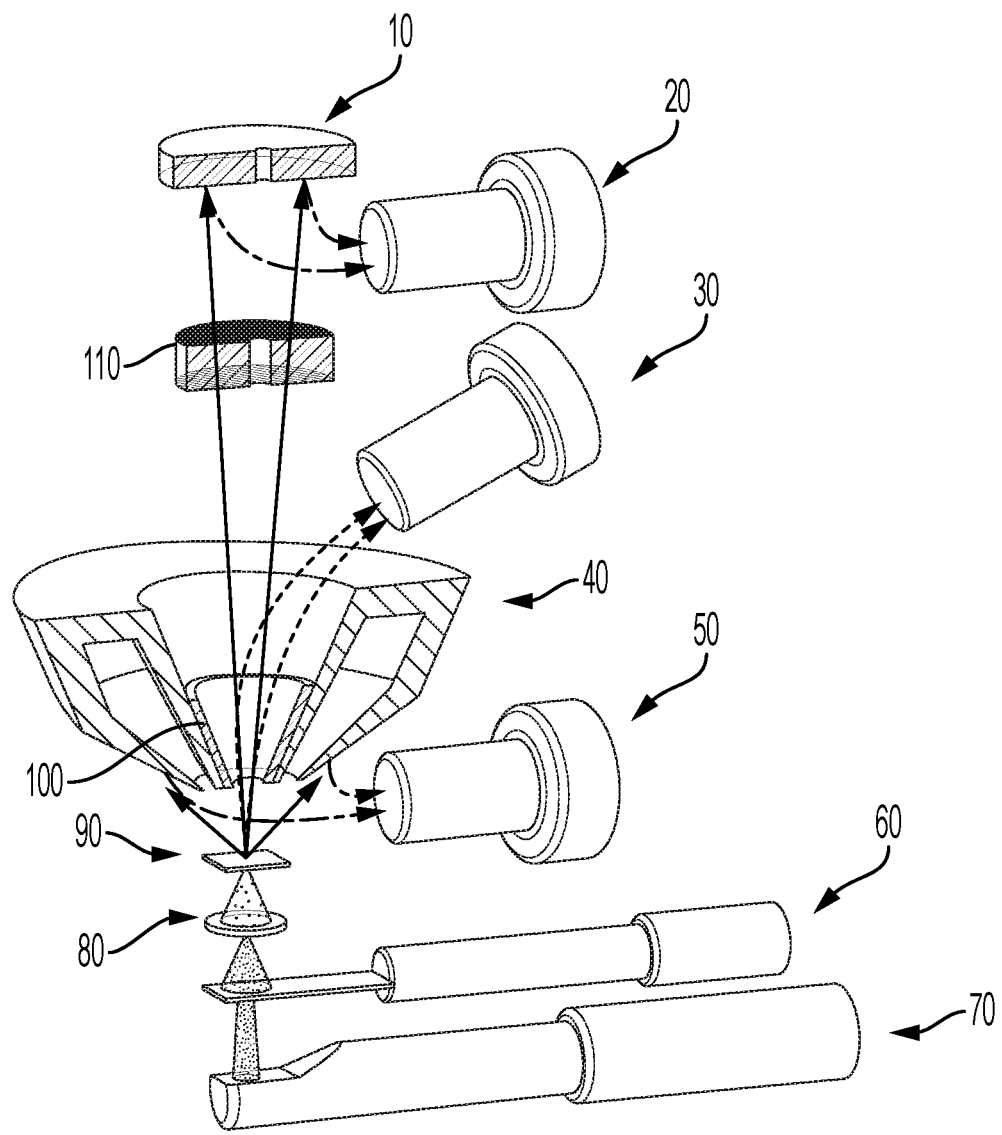
FIG. 2 is a schematic illustration showing imaging of a sample in an exemplary electron microscope according to one aspect.

FIG. 2 shows a schematic of an exemplary electron microscope using the disclosed herein assembly (START electron microscope holder). As shown in FIG. 2, such an exemplary electron microscope can comprise the disclosed herein modular reel-to-reel assembly 90 (shown schematically) that comprises samples of interest. The signal can be collected by a lower detector 50 that can be used for longer working distance secondary electron (SE) imaging of exemplary surface topography. The upper detector 30 can be used to collect both secondary electrons (SE) and backscattered electrons (BSE) passing through the lens 40. The top detector 20 can be used to collect the secondary electrons generated following collision and amplification with the conversion plate 10, or unfiltered backscattered electrons coming back up the electron microscope column through the high-pass filter 110.

In certain aspects, a signal ratio of SE-BSE can be adjusted by changing the voltage of the signal conversion electrode 100 in the objective lens 40.

In addition to SE imaging for surface topography observation, electron microscopes disclosed herein can also be used in transmission mode. In such aspects, appropriate detectors can be positioned below the sample. In such exemplary aspects, both Bright Field (BF)-STEM (electron absorption) and Dark Field (DF)-STEM imaging can be applied using the disclosed herein holders and appropriate detectors. The DF-STEM detector 80 can be positioned underneath the sample, as shown in FIG. 2.

In certain aspects, the DF-STEM detector can be moved and replaced with a light microscope, as described in detail below. The BF-STEM aperture 60 and detector 70 are also shown in FIG. 2. It is understood, and without being bound by any theory, in BF-STEM observation, it is possible to obtain high contrast images even of light element materials, such as organic samples, as a result of the application of accelerating voltages up to 30 kV. In yet further aspects, the use of an optional BF-STEM aperture 60 can allow obtaining higher contrast imaging by controlling the detection angle. It is understood that in aspects where the SEM is used in transmission mode, the apertures present in the disclosed assembly allow the use of DF-STEM and BF-detectors.

In yet further aspects, the electron microscope can comprise a light microscope. In such aspects, the disclosed herein assembly can be adapted to imaging with a light microscope. Light microscopy techniques can comprise fluorescence microscopy. In certain aspects, fluorescence imaging can be done in 2D. In such aspects, the depth in the sample, which provides the 2D image can be controlled by the localized focusing of the light stimulation. While in other aspects, the fluorescence imaging can also be done in 3D by using a confocal approach. In yet further aspects, the electron microscope can be adapted for use with an inverted light microscope.

Figure 11A:
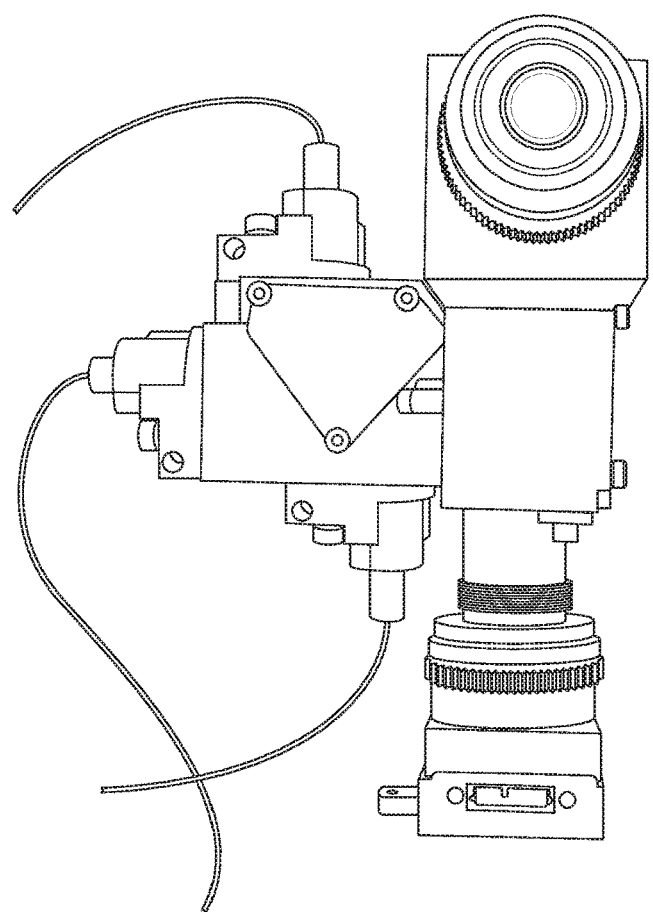
FIGS. 11A-11C depict a schematic illustration of a fluorescence microscope according to one aspect.
Figure 11B:
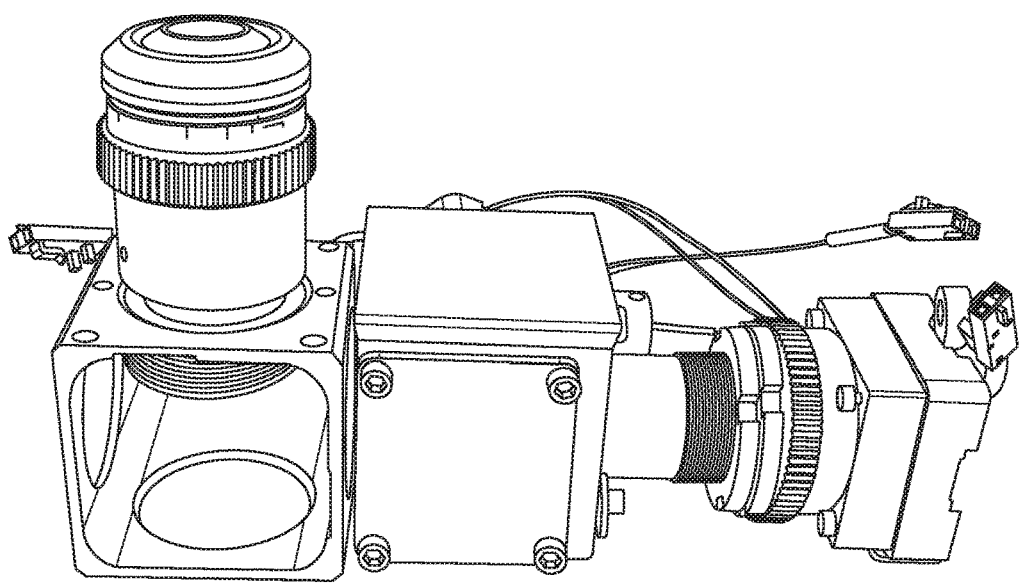
Figure 11C:
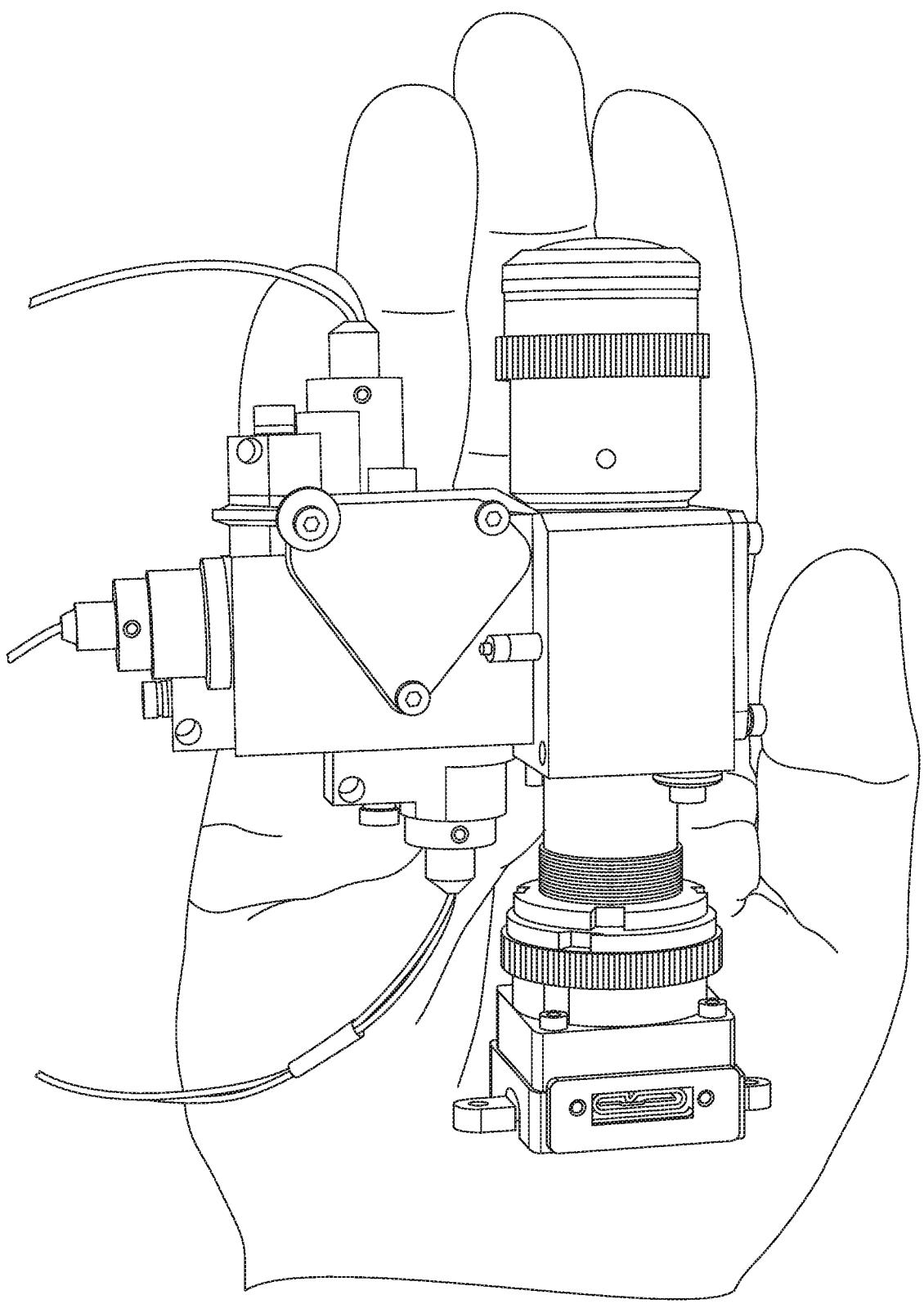
Figure 12C:
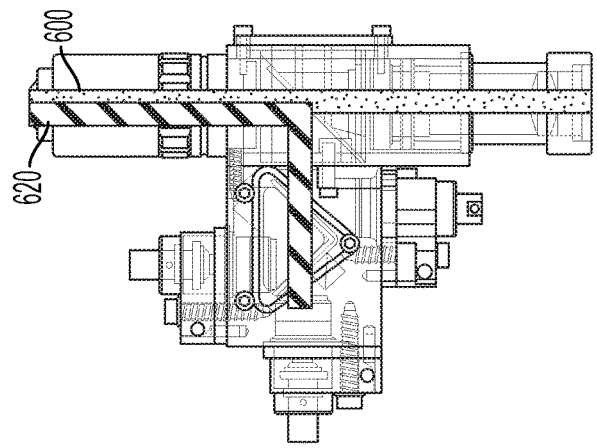
FIGS. 12A-12C depict a schematic illustration of a three-channel fluorescence microscope according to one aspect.
Figure 12B:
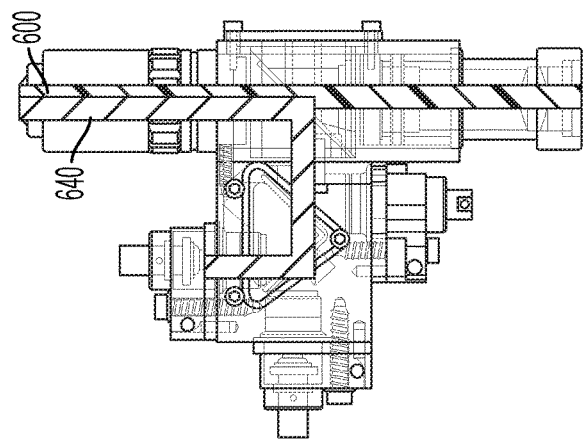
Figure 12A:
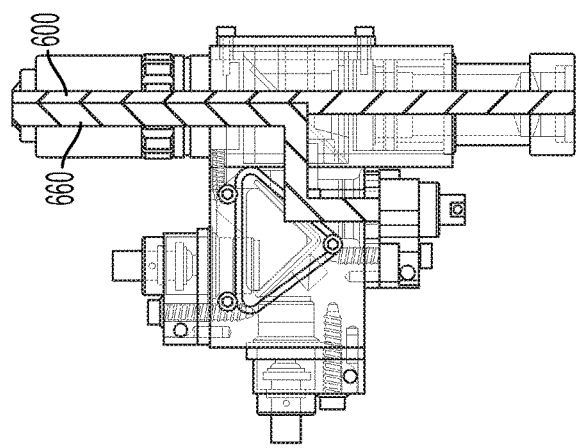
Figure 13A:
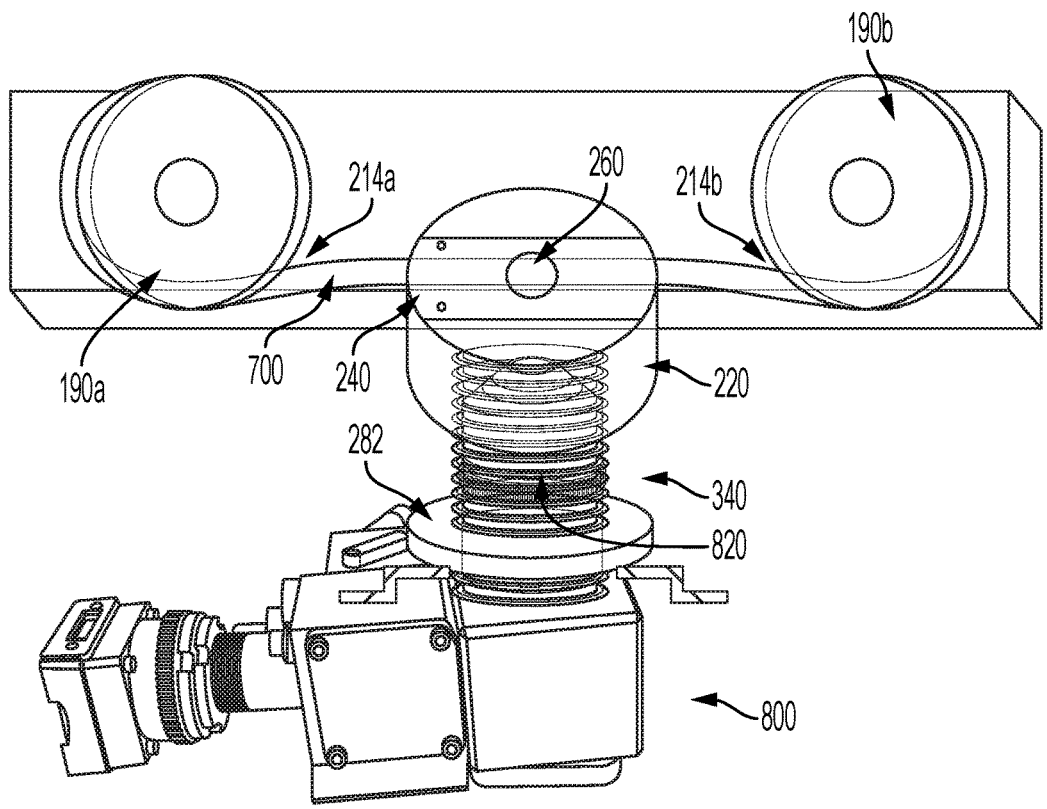
FIGS. 13A-13C depict a schematic illustration of using a fluorescence microscope with the disclosed assembly according to one aspect.
Figure 13B:
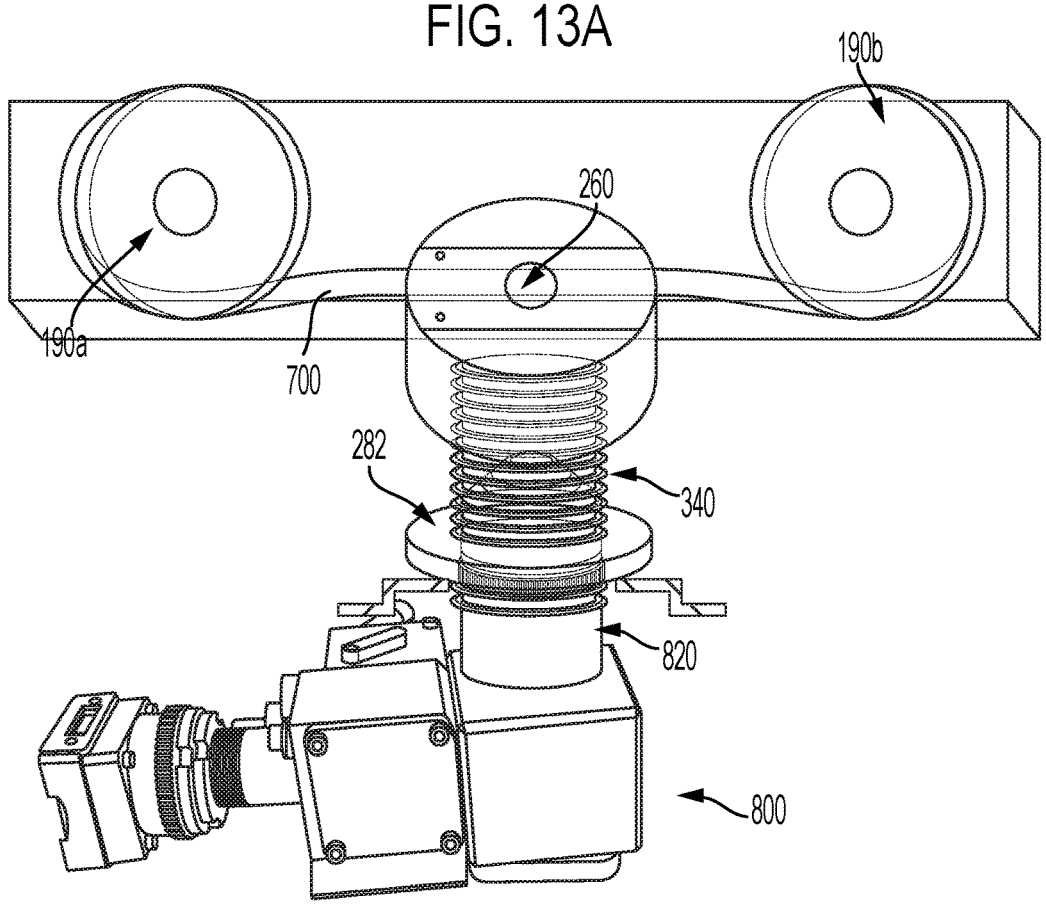
Figure 13C:
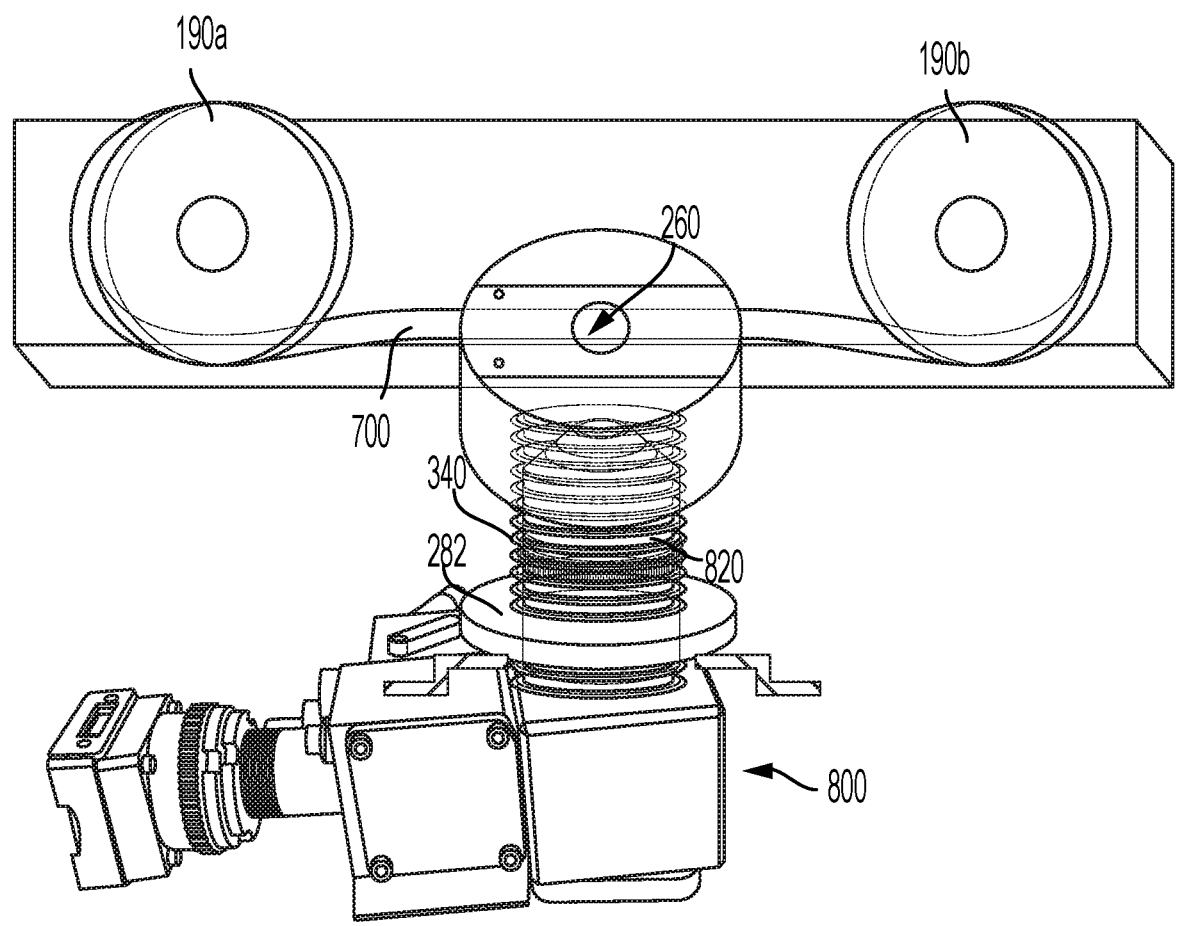

An exemplary fluorescent microscope and its use are shown in FIGS. 11-13. This fluorescent microscope is configured to fit inside a commercial electron microscope chamber. In the aspects disclosed herein, and as shown in FIGS. 13A-13C, an exemplary fluorescent microscope 800, is positioned below the disclosed assembly. In such aspects, the fluorescent microscope can have a length between 100 to 160 mm and a height of less than about 100 mm. It is understood that the fluorescent microscope is positioned such that its objective 820 fits within the third aperture 320 positioned on the bottom surface of the electron-stage-engaging platform. In still further aspects, the objective 820 can fit within the hollow fastener 340 that extends through the first, the third apertures, and at least partially through the second aperture. In still further aspects, the objective 820 can fit thought the locking nut 282. In yet further aspects, the objective 820 can be moved within the fastener up and down (FIGS. 13A-13C) as needed to collect the signal from the sample-containing tape 700 when it passes through the second aperture 260 on the top surface of the sampling platform. In such aspects, the fluorescent microscope 800 is configured to collect emitted light from a backside of a sample of the plurality of ultramicrotome samples positioned on the sample-containing tape 700. It is understood that an alignment of the first, the second, and the third apertures allows the collection of the emitted light from the back portion of the sample into the objective 820 of the microscope. The fluorescent microscope is directly coupled with a digital camera configured to capture the image. It is understood that in the aspects disclosed herein, the digital camera is positioned with the fluorescent microscope inside of the electron microscope chamber.

It is further understood that in a certain aspect, the fluorescent microscope is made of the materials having predetermined magnetically shielding properties. For example, in some aspects, a body of the microscope can be made from aluminum or aluminum/alloys. In yet further aspects, the camera that is attached to the fluorescence microscope can comprise an aluminum or aluminum alloy covering. In still further aspects, at least a portion of the optical parts of the fluorescence microscope can comprise an aluminum or aluminum alloy covering.

In still further aspects, any known in the art digital cameras can be used to capture the image. In some aspects, the cameras attached to the disclosed herein fluorescent microscope comprise sensors comprising CCD (Charge Coupled Devices) and/or sCMOS (scientific Complementary Metal Oxide Semiconductors). It is understood that the user can select an appropriate camera based on the desired sensitivity and signal-to-noise ratio. In certain aspects, it is understood that color cameras can have a different resolution and sensitivity than monochrome cameras. In certain aspects, the cameras used herein can be color cameras. While in other aspects, the cameras used herein can be monochrome.

In still further exemplary aspects and unlimiting aspects, the cameras used herein can comprise a monochrome sCMOS sensor comprising, 5 megapixels. The disclosed cameras can have a C-mount. In yet further exemplary aspects, the cameras can operate at a video rate of 10 frames per second (or up to 30 fps with reduced frame size). The image size is from 100×100 to 1900×1900 pixels. The camera is configured to provide images with JPG, BMP, TIG, and/or PNG format.

In some aspects, the fluorescent microscope disclosed herein can be a confocal fluorescence microscope. Yet in other aspects, the fluorescent microscope disclosed herein can be an epifluorescence microscope. In still further aspects, the fluorescent microscope used herein can comprise a three-channel epifluorescence microscope configured to collect three different colors, as shown in FIGS. 12A-12C. In such aspects, the light travels through the objective lens 600 to illuminate the sample, and then the light emitted from the sample travels back through the same objective to the detector. In exemplary aspects disclosed herein, the detector is configured to collect light in 400-430 nm range (violet light) (660), in 465-500 nm range (green light) (640), and 580-620 nm range (orange light) (620).

In yet further aspects, and as disclosed herein, other detectors can be used for imaging. For example, and as mentioned above, the disclosed assembly can be used to collect an SEM image, a BSE image, an EDX, image, an Auger-SEM image, and/or an EELS-image. In aspects when both the DF-STEM detector and the disclosed herein fluorescence microscope both are present in the electron microscope, such detectors can be configured to move within the chamber and to exchange positions when required. More specifically, in such aspects, each detector can be programmed to move to a designated location within the chamber to allow the use of another detector. For example, after an image using the DF-STEM detector is collected, a user can retract the DF-STEM detector by use of software and to move a fluorescent microscope into its place, and so on. In such aspects, the systems and assemblies disclosed herein can be used in the correlative STEM that allows the use of DF-STEM and BF-STEM in correlation with the fluorescence microscope.

In still further aspects, disclosed herein also are systems for electron microscopy imaging comprising: a) a modular reel-to-reel assembly comprising a reel-to-reel frame comprising: i) a strut having a first surface and an opposite second surface, a first end and a second end, wherein the strut detachably holds: 1) a mounting bracket having a top surface and a bottom surface and extending from the first surface of the strut and is positioned perpendicularly to the first surface of the strut, wherein the mounting bracket comprises a first aperture extending from the top surface to the bottom surface; 2) a feeder motor and a take-up motor coupled to the second surface of the strut such that the feeder motor is spaced from the take-up motor by a predetermined distance; 3) a first rod detachably coupled with the feeder motor through the strut, such that the first rod extends from the first surface of the strut in parallel to the mounting bracket, wherein the feeder motor is configured to spin the first rod at a predetermined speed; and 4) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod; ii) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed; and wherein the reel-to-reel assembly is adapted for use in an electron microscope chamber; and b) a control unit, wherein the control unit is controlling the predetermined speed of the feeder motor and the predetermined speed of the take-up motor.

Yet in other aspects, also disclosed herein are systems for electron microscopy imaging comprising: i) a strut having a first surface and an opposite second surface, a first end and a second end, wherein the strut detachably holds: 1) a mounting bracket having a top surface and a bottom surface and extending from the first surface of the strut and is positioned perpendicularly to the first surface of the strut, wherein the mounting bracket comprises a first aperture extending from the top surface to the bottom surface; 2) a feeder motor and a take-up motor coupled to the second surface of the strut such that the feeder motor is spaced from the take-up motor by a predetermined distance; 3) a first rod detachably coupled with the feeder motor through the strut, such that the first rod extends from the first surface of the strut in parallel to the mounting bracket, wherein the feeder motor is configured to spin the first rod at a predetermined speed; and 4) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod; ii) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed; iii) a sampling platform comprising a top surface and a bottom surface, wherein the bottom surface of the sampling platform is configured to be detachably attached to the top surface of the mounting bracket, wherein the top surface of the sampling platform is configured to receive the sample-containing tape as it is relayed from the feeder reel to the take-up reel or from the take-up reel to the feeder reel; iv) an electron-microscope-stage-engaging platform detachably connected to the bottom surface of the mounting bracket; and b) a control unit, wherein the control unit is controlling the predetermined speed of the feeder motor and the predetermined speed of the take-up motor.

It is understood that the assemblies used in the disclosed above systems can comprise any of the assemblies described above. In other words, the assemblies present in the systems can comprise all the disclosed parts, or only a few of the disclosed parts, depending on the specific application. In yet further aspects, any of the disclosed herein systems can be used in any of the described above electron microscopes. The systems are also adapted for use in any of the disclosed herein detectors.

A system as described herein makes use of any of the assemblies disclosed herein for, in-situ nanomanipulation, experimentation and analysis of samples of the plurality of ultramicrotome sample disposed on the sample-containing tape directly within an electron microscope. In certain unlimiting aspects, the systems disclosed herein also can be adapted for in-situ thermal treatment. For example, the assemblies and systems disclosed herein can be adapted to use with a device that transduces electrical signals to heat where the device can also be positioned within the sampling platform, for example. However, it is understood that this specific positioning is not limiting, and it can be positioned anywhere on the disclosed assembly as long as it configured to transfer heat to the sample if desired. In such aspects, the control system can be used to apply an electrical signal to the device, and thermal experiments can be conducted directly within the electron microscope while collecting in-situ imaging with DF or BF detectors or a fluorescence microscope.

In yet further aspects, the reel-to-reel assembly disclosed herein, along with the systems disclosed herein can be adapted for use with other known in the art nano-manipulators. In such exemplary aspects, a tungsten probe, for example, can be used to probe any of the desired samples of the plurality of ultramicrotome samples for the purpose of a target/feature extraction via nano-scooping. In yet further aspects, the assemblies and the systems disclosed herein can be adapted for a single-cell multi-omics approach to investigate the complex interaction between genotype and phenotype of the cells.

In still further aspects, the assemblies and the systems, as described herein, can be used to conduct single experiments or multiple experiments.

Devices that support multiple experiments can be used with the assemblies and systems to conduct experiments sequentially, simultaneously with other experiments, or as any combination of simultaneous and sequential experiments.

Methods

Also disclosed herein are methods of sample imaging comprising providing any of the disclosed above reel-to-reel assemblies, inserting the assembly comprising the sample-containing tape into an electron microscope chamber and imaging the sample-containing tape. It is understood that in such aspects, the sample-containing tape comprises a plurality of ultramicrotome samples.

It is understood that in aspects disclosed herein, the feeder reel and the take-up reel, as disclosed above, can be adapted for use with other assemblies specifically designed for other desired processes. For example, and without limitation, the feeder reel and the take-up reel as disclosed herein can be used with an ultramicrotome system. The use of these reels with the ultramicrotome systems is described in the co-pending and commonly owned patents, such as U.S. Provisional Application No. 62/883,496, filed on Aug. 6, 2019; U.S. Provisional Application No. 62/883,918, filed on Aug. 7, 2019, and U.S. Provisional Application No. 62/891,067, filed on Aug. 23, 2019, the contents of which are incorporated herein in their whole entireties. When the feeder reel and the take-up reel are used with the ultramicrotome system, a plurality of ultramicrotome samples can be formed on a tape, thereby forming the sample-containing tape as described herein.

In yet further aspects, the methods disclosed herein can use any of the disclosed above control systems. In such aspects, and as disclosed above, the control system is configured to control slicing of the plurality of ultramicrotome samples by an ultramicrotome prior to the step of providing such that each of the plurality of ultramicrotome samples is positioned sequentially on the sample-containing tape. In such aspects, the control unit is configured to determine the positioning of each of the plurality of ultramicrotome samples on the sample-containing tape. In yet further aspects and as disclosed above, the control unit is configured to advance the sample-containing tape from the feeder reel to the take-up reel. While in still further aspects, the control unit is configured to move the sample-containing tape backward from the take-up reel to the feeder reel.

Again and as discussed above, disclosed herein aspect where the step of inserting (or loading) the assembly within the chamber comprises detachably attaching the assembly to at least one transferring rod and transferring the assembly from an airlock chamber into the electron microscope chamber. Yet in other aspects, the step of inserting (or loading) the assembly within the chamber comprises detachably attaching the assembly directly on an electron microscope stage inside the electron microscope chamber without the use of a transfer rod.

As disclosed in detail above, the step of imaging can comprise collecting an SEM image, a BSE image, an EDX image, and EELS image, an Auger-SEM image, or a fluorescence spectra, or any combination thereof. In still further aspects, and as disclosed above, the fluorescence spectra can be obtained with a fluorescence microscope. Any of the disclosed above fluorescence microscopes can be used. In still further aspects, and as discussed in detail above, the fluorescence microscope can be positioned underneath the electron microscope stage and is configured to image a back surface of the sample-containing tape. In such aspects, the image is collected through the apertures present in the disclosed above assembly.

Still further disclosed are aspects, where the step of imaging comprises rotating the feeder reel and the take-up reel at a predetermined speed to arrive a predetermined sample of the plurality of ultramicrotome samples and collecting an image of the predetermined sample. Again, any image can be collected at the specific sample. The advance of the tape can be done as disclosed above by using the control system. The methods also comprise collecting conductivity data or using in-situ heating as described above.

The claims are not intended to include, and should not be interpreted to include, means-plus- or step-plus-function limitations, unless such a limitation is explicitly recited in a given claim using the phrase(s) "means for" or "step for," respectively.

In view of the described processes and compositions, hereinbelow are described certain more particularly described aspects of the inventions. These particularly recited aspects should not, however, be interpreted to have any limiting effect on any different claims containing different or more general teachings described herein, or that the "particular" aspects are somehow limited in some way other than the inherent meanings of the language and formulas literally used therein.

The invention claimed is:

1. A modular reel-to-reel assembly for an electron microscope imaging comprising:
a reel-to-reel frame comprising:
  a) a strut having a first surface and an opposite second surface, a first end and a second end, wherein the strut detachably holds:
    i) a mounting bracket having a top surface and a bottom surface and extending from the first surface of the strut and positioned perpendicularly to the first surface of the strut, wherein the mounting bracket comprises a first aperture extending from the top surface to the bottom surface;
    ii) a feeder motor and a take-up motor coupled to the second surface of the strut such that the feeder motor is spaced from the take-up motor by a predetermined distance;
    iii) a first rod detachably coupled with the feeder motor through the strut, such that the first rod extends from the first surface of the strut in parallel to the mounting bracket, wherein the feeder motor is configured to spin the first rod at a predetermined speed, and
    iv) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod; and
  b) a feeder reel having a top portion and a bottom portion detachably and rotatably coupled to the first rod and a take-up reel having a top portion and a bottom portion detachably and rotatably coupled to the second rod;
  wherein the feeder reel is configured to relay a sample-containing tape to the take-up reel at a first speed; and
  wherein the reel-to-reel assembly is adapted for use in an electron microscope chamber.

2. The assembly of claim 1, wherein the take-up reel is configured to send the sample-containing tape back to the feeder reel at a second speed, and wherein the first speed and the second speed are the same or different.

3. The assembly of claim 1, further comprising a sampling platform comprising a top surface and a bottom surface, wherein the bottom surface of the sampling platform is configured to be detachably attached to the top surface of the mounting bracket, wherein the top surface of the sampling platform is configured to receive the sample-containing tape as it is relayed from the feeder reel to the take-up reel or from the take-up reel to the feeder reel.

4. The assembly of claim 3, wherein the sampling platform comprises a second aperture extending through the sampling platform from the top surface to the bottom surface of the platform.

5. The assembly of claim 4, wherein the bottom surface of the sampling platform overlies the mounting bracket such that the first aperture and the second aperture are substantially aligned.

6. The assembly of claim 5, wherein the electron-microscope-stage-engaging platform has a third aperture aligned with the first aperture and the second aperture, and wherein the electron-microscope-stage engaging platform is adapted to slidably connect with an electron microscope stage positioned in an electron microscope chamber.

7. The assembly of claim 3, wherein the sample-containing tape is relayed from the bottom portion of the feeder reel to the sampling platform and to the bottom portion of the take-up reel and/or wherein the sample-containing tape is relayed from the bottom portion of the take-up reel to the sampling platform and to the bottom portion of the feeder reel.

8. The assembly of claim 1, wherein the bottom surface of the mounting bracket is adapted to connect the reel-to-reel frame to an electron-microscope-stage-engaging platform.

9. The assembly of claim 1, wherein the feeder reel and the take-up reel are adapted to connect with an ultramicrotome.

10. The assembly of claim 1, wherein the sample-containing tape comprises a plurality of ultramicrotome samples.

11. The assembly of claim 10, wherein the control unit is configured to identify the positioning of each of the plurality of ultramicrotome samples on the sample-containing tape and/or wherein the control unit is configured to rotate the feeder reel and the take-up reel to a predetermined position such that a predetermined sample of the plurality of ultramicrotome samples is imaged.

12. The assembly of claim 10, wherein the sampling platform comprises at least two electrical connectors that are in intimate contact with at least a portion of the sampling-containing tape, and wherein the at least two electrical connectors are configured to measure conductivity of a sample of the plurality of ultramicrotome samples.

13. The assembly of claim 1, wherein the assembly is detachably attached to a control unit, wherein the control unit is controlling the predetermined speed of the feeder motor and the predetermined speed of the take-up motor.

14. The assembly of claim 1, further comprising a device configured to transmit heat to the sample-containing tape.

15. The assembly of claim 1, wherein the feeder reel and the take-up reel, each comprises two wheels connected with a spool, wherein the spool is adapted for receiving and relaying the sample-containing tape.

16. The assembly of claim 1, wherein the assembly is adapted to be tilted, rotated and/or moved in x, y, and/or z directions when is positioned within an electron microscope chamber.

17. The assembly of claim 1, wherein the assembly is adapted to imagining with a light microscope, wherein a light beam from the light microscope illuminates a back surface of the sample-containing tape through the third, second, and the first apertures.

18. An electron microscope comprising:
   a chamber comprising a stage detachably connected with a modular assembly of claim 1.

19. A method of sample imaging comprising:
   providing the modular reel-to-reel assembly of claim 1;
   inserting the modular reel-to-reel assembly into an electron microscope chamber; and
   imaging the sample-containing tape.

20. A modular reel-to-reel assembly for an electron microscope imaging comprising:
   a reel-to-reel frame comprising:
      a) a strut having a first surface and an opposite second surface, a first end and a second end, wherein the strut detachably holds:
         i) a mounting bracket having a top surface and a bottom surface and extending from the first surface of the strut and is positioned perpendicularly to the first surface of the strut, wherein the mounting bracket comprises a first aperture extending from the top surface to the bottom surface;
         ii) a feeder motor and a take-up motor coupled to the second surface of the strut such that the feeder motor is spaced from the take-up motor by a predetermined distance;
         iii) a first rod detachably coupled with the feeder motor through the strut, such that the first rod extends from the first surface of the strut in parallel to the mounting bracket, wherein the feeder motor is configured to spin the first rod at a predetermined speed, and
         iv) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod;
      b) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed;
      c) a sampling platform comprising a top surface and a bottom surface, wherein the bottom surface of the sampling platform is configured to be detachably attached to the top surface of the mounting bracket, wherein the top surface of the sampling platform is configured to receive the sample-containing tape as it is relayed from the feeder reel to the take-up reel or from the take-up reel to the feeder reel; and
      d) an electron-microscope-stage-engaging platform detachably connected to the bottom surface of the mounting bracket; and
   wherein the reel-to-reel assembly is adapted for use in an electron microscope chamber.

21. A system for electron microscopy imaging comprising:
   a) a modular reel-to-reel assembly comprising a reel-to-reel frame comprising:
      i) a strut having a first surface and an opposite second surface, a first end and a second end, wherein the strut detachably holds:
         1) A mounting bracket having a top surface and a bottom surface and extending from the first surface of the strut and is positioned perpendicularly to the first surface of the strut, wherein the mounting bracket comprises a first aperture extending from the top surface to the bottom surface;
         2) A feeder motor and a take-up motor coupled to the second surface of the strut such that the feeder motor is spaced from the take-up motor by a predetermined distance;
         3) a first rod detachably coupled with the feeder motor through the strut, such that the first rod extends from the first surface of the strut in parallel to the mounting bracket, wherein the feeder motor is configured to spin the first rod at a predetermined speed, and
         4) a second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod;
      ii) a feeder reel having a top portion and a bottom portion detachably and rotatably coupled to the first rod and a take-up reel having a top portion and a bottom portion detachably and rotatably coupled to the second rod;

wherein the feeder reel is configured to relay a sample-containing tape to the take-up reel at a first speed; and wherein the reel-to-reel assembly is adapted for use in an electron microscope chamber; and b) a control unit, wherein the control unit is controlling the predetermined speed of the feeder motor and the predetermined speed of the take-up motor.

22. A system for electron microscopy imaging comprising:

a) a modular reel-to-reel assembly comprising a reel-to-reel frame comprising:

i) a strut having a first surface and an opposite second surface, a first end and a second end, wherein the strut detachably holds:

1) A mounting bracket having a top surface and a bottom surface and extending from the first surface of the strut and positioned perpendicularly to the first surface of the strut, wherein the mounting bracket comprises a first aperture extending from the top surface to the bottom surface;

2) A feeder motor and a take-up motor coupled to the second surface of the strut such that the feeder motor is spaced from the take-up motor by a predetermined distance;

3) a first rod detachably coupled with the feeder motor through the strut, such that the first rod extends from the first surface of the strut in parallel to the mounting bracket, wherein the feeder motor is configured to spin the first rod at a predetermined speed, and 4) A second rod detachably coupled with the take-up motor through the strut, such that the second rod extends from the first surface of the strut in parallel to the mounting bracket, wherein the take-up motor is configured to spin the second rod at a predetermined speed that is the same or different as the predetermined speed of rotations of the first rod;

ii) a feeder reel having a top portion and a bottom portion detachably and rotatably coupled to the first rod and a take-up reel having a top portion and a bottom portion detachably and rotatably coupled to the second rod; wherein the feeder reel is configured to relay a sample-containing tape to the take-up reel at a first speed;

iii) a sampling platform comprising a top surface and a bottom surface, wherein the bottom surface of the sampling platform is configured to be detachably attached to the top surface of the mounting bracket, wherein the top surface of the sampling platform is configured to receive the sample-containing tape as it is relayed from the feeder reel to the take-up reel or from the take-up reel to the feeder reel; and iv) an electron-microscope-stage-engaging platform detachably connected to the bottom surface of the mounting bracket; and wherein the reel-to-reel assembly is adapted for use in an electron microscope chamber; and b) a control unit, wherein the control unit is controlling the predetermined speed of the feeder motor and the predetermined speed of the take-up motor.

* * * * *